(12) United States Patent
Park et al.

(10) Patent No.: US 7,935,579 B2
(45) Date of Patent: May 3, 2011

(54) THIN FILM TRANSISTOR ARRAY SUBSTRATE AND METHOD FOR FABRICATING THE SAME

(75) Inventors: Yong In Park, Gyeonggi-do (KR); Jae Young Oh, Gyeonggi-do (KR); Sang Chul Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/646,486

(22) Filed: Dec. 28, 2006

(65) Prior Publication Data

US 2007/0284586 A1 Dec. 13, 2007

(30) Foreign Application Priority Data

May 24, 2006 (KR) ..................... 10-2006-0046548

(51) Int. Cl.
*H01L 21/00* (2006.01)
*H01L 21/84* (2006.01)

(52) U.S. Cl. ........ 438/149; 438/150; 438/151; 438/159; 257/E21.412

(58) Field of Classification Search .................... 438/149
See application file for complete search history.

(56) References Cited

U.S. PATENT DOCUMENTS

| | | | | |
|---|---|---|---|---|
| 5,346,833 A | * | 9/1994 | Wu | 438/30 |
| 5,478,766 A | * | 12/1995 | Park et al. | 438/158 |
| 5,976,902 A | * | 11/1999 | Shih | 438/30 |
| 6,255,130 B1 | * | 7/2001 | Kim | 438/30 |
| 6,537,840 B2 | * | 3/2003 | Tseng | 438/30 |
| 6,664,149 B2 | * | 12/2003 | Shih | 438/151 |
| 6,818,923 B2 | * | 11/2004 | Kim et al. | 257/72 |
| 6,861,368 B2 | * | 3/2005 | Chae | 438/738 |
| 6,956,626 B2 | * | 10/2005 | Tseng | 349/40 |
| 2003/0197187 A1 | * | 10/2003 | Kim et al. | 257/83 |

(Continued)

FOREIGN PATENT DOCUMENTS

CN 1353328 A 6/2002

(Continued)

OTHER PUBLICATIONS

Office Action issued in corresponding Taiwanese Application No. 095145650 on Jan. 29, 2010.

*Primary Examiner* — Charles D Garber
*Assistant Examiner* — Pape Sene
(74) *Attorney, Agent, or Firm* — Morgan, Lewis & Bockius LLP

(57) ABSTRACT

A TFT array substrate includes a gate line, a gate electrode, and a gate pad on a substrate, each of which including stacked layers of a first metal and a transparent conductive material, respectively, a pixel electrode formed of the transparent conductive material, a gate insulation layer on the substrate including the gate line and the gate electrode, the gate insulation layer having first and second open areas exposing the pixel electrode and the gate pad, a semiconductor layer formed on the gate insulation layer, a data line crossing the gate line to define a sub-pixel region, a source electrode diverging from the data line, a drain electrode spaced apart from the source electrode and connected to the pixel electrode, a data pad at an end of the data line; a masking layer covering the data line, the source electrode and the drain electrode, and an oxidation-prevention layer covering the gate pad and the data pad.

13 Claims, 22 Drawing Sheets

U.S. PATENT DOCUMENTS

| | | | |
|---|---|---|---|
| 2004/0126917 A1* | 7/2004 | Yoo et al. | 438/30 |
| 2004/0161708 A1* | 8/2004 | Nagase et al. | 430/313 |
| 2005/0006647 A1* | 1/2005 | Utsunomiya | 257/72 |
| 2005/0046762 A1* | 3/2005 | Kim et al. | 349/38 |
| 2005/0077517 A1* | 4/2005 | Chang et al. | 257/59 |
| 2005/0077524 A1* | 4/2005 | Ahn et al. | 257/72 |
| 2006/0038181 A1* | 2/2006 | Tseng | 257/72 |

FOREIGN PATENT DOCUMENTS

| | | |
|---|---|---|
| CN | 1606162 A | 4/2005 |
| TW | 253533 I | 9/2004 |
| TW | 253538 I | 4/2006 |
| TW | 254831 I | 5/2006 |
| TW | 255045 I | 5/2006 |

* cited by examiner

THIN FILM TRANSISTOR ARRAY SUBSTRATE AND METHOD FOR FABRICATING THE SAME

This application claims the benefit of the Korean Patent Application No. 10-2006-0046548, filed on May 24, 2006, which is hereby incorporated by reference in its entirety.

BACKGROUND OF THE INVENTION

1. Field of the Invention

Embodiments of the present invention relate to a liquid crystal display (LCD) device, and more particularly, to a thin film transistor (TFT) array substrate and a method for fabricating the same, for an LCD device. Embodiments of the invention are suitable for a wide scope of applications. In particular, embodiments of the invention are suitable for reducing a number of exposure masks in a fabrication process of the LCD device.

2. Discussion of the Related Art

Among various flat panel display devices, an LCD device has gained great interest because it provides a high contrast ratio, wide gray scale range, displays high-quality moving images, and consumes low power. The LCD device includes various elements forming various driving patterns or lines on a substrate. Generally, these patterns of the LCD device are formed by a photolithography process.

The photolithography process involves complicated steps of coating thin film layers on a substrate with photoresist which is sensitive to ultraviolet rays; exposing and development of the substrate through an exposure mask positioned above the substrate; etching the film layer by using the patterned photoresist as a mask; and stripping the photoresist.

A TFT array substrate of a related art LCD device includes a gate line layer, a gate insulation layer, a semiconductor layer, a data line layer, a passivation layer, and a pixel electrode. Five to seven steps are generally needed to form the above-mentioned elements on the TFT array substrate. The likelihood of error increases with the number of masks used in the photolithography process. Recently, new approaches have been investigated for improving productivity and the process margin by using a reduced number of masks in the photolithography process.

FIGS. 1A to 1E show cross-sectional views of a process of fabricating a TFT array substrate according to the related art. First, as shown in FIG. 1A, a low-resistance metal material is deposited on a substrate 11 and is treated by photolithography to form a plurality of gate lines (not shown), a gate electrode 12a, and a gate pad 22. In this case, the low-resistance metal material may include copper (Cu), aluminum (Al), aluminum neodymium (AlNd), molybdenum (Mo), or chrome (Cr), etc.

The photolithography is performed as follows. First, the low-resistance metal layer is deposited on a transparent glass substrate having a good heat-resistance under a high temperature, and coated with a photoresist. Then, a first mask having a first pattern layer is positioned above the photoresist on the substrate. Light is selectively applied to the substrate through the first mask. Thus, a predetermined pattern is formed on the photoresist in accordance with the first pattern layer.

Next, a predetermined portion of the photoresist is removed by using a developer to pattern the photoresist. Light is irradiated through the predetermined portion of the photoresist on an exposed portion of the metal layer. Then, the exposed portion of the metal layer is selectively etched to obtain a desired pattern in the metal layer.

Next, as shown in FIG. 1B, an inorganic material layer is deposited on the entire surface of the substrate including the gate electrode 12a at a high temperature to form a gate insulation layer 13. In this case, the inorganic material may include silicon nitride (SiNx) or silicon oxide (SiOx). Then, an amorphous silicon layer is deposited on the gate insulation layer 13, and is then patterned by photolithography using a second mask. Accordingly, an island-shaped semiconductor layer 14 is formed on the gate insulation layer 13, wherein the semiconductor layer 14 overlaps the gate electrode 12a.

Referring to FIG. 1C, a low-resistance metal layer is deposited on the entire surface of the substrate including the semiconductor layer 14. In this case, the low-resistance metal layer may include copper (Cu), aluminum (Al), aluminum neodymium (AlNd), molybdenum (Mo), or chrome (Cr). Then, the low-resistance metal layer is patterned by photolithography using a third mask, whereby a data line layer is formed.

The data line layer includes a data line (not shown) which perpendicular to the gate line, to thereby define a pixel region; source and drain electrodes 15a and 15b overlapped with both sides of the semiconductor layer 14; and a data pad 25 in a pad region. The deposited gate electrode 12a, gate insulation layer 13, semiconductor layer 14 and source and drain electrodes 15a and 15b form a TFT for switching on and off state a voltage applied to the pixel region.

Next, as shown in FIG. 1D, an organic insulation layer of BCB or an inorganic insulation of SiNx is formed onto the entire surface of the substrate including the drain electrode 15b to form a passivation layer 16. Then, portions of the passivation layer 16 are removed by photolithography using a fourth mask to form a contact hole 71 exposing the drain electrode 15b, a first pad open area 81a exposing the gate pad 22, and a second pad open area 81b exposing the data pad 25.

As shown in FIG. 1E, a transparent conductive material layer, for example, indium tin oxide (ITO) or indium zinc oxide (IZO) is deposited on the entire surface of the substrate including the passivation layer 16, and is then patterned by photolithography using a fifth mask. Thus, a pixel electrode 17 is formed in the pixel region. The pixel electrode 17 is electrically connected with the drain electrode 15b, thereby completing the TFT array substrate. Then, a transparent conductive layer 27 is formed by covering the first and second pad open areas to prevent an oxidation of the gate and data pads.

Accordingly, the related art TFT array substrate requires five exposure masks to form the gate line layer, the semiconductor layer, the data line layer, the contact hole of the passivation layer, and the pixel electrode. The fabrication process becomes more complicated with the number of masks. Also fabrication time and cost increases, reducing efficiency.

SUMMARY OF THE INVENTION

Accordingly, the present invention is directed to a TFT array substrate and a method for fabricating the same, which substantially obviate one or more problems due to limitations and disadvantages of the related art.

An object of the present invention is to provide a TFT array substrate and a method for fabricating the same using a reduced number of exposure masks.

Another object of the present invention is to reduce a process time and cost in a method for fabricating a TFT array substrate.

Additional features and advantages of the invention will be set forth in the description of exemplary embodiments which follows, and in part will be apparent from the description of the exemplary embodiments, or may be learned by practice of the exemplary embodiments of the invention. These and other advantages of the invention will be realized and attained by the structure particularly pointed out in the written description of the exemplary embodiments and claims hereof as well as the appended drawings.

To achieve these and other advantages and in accordance with the purpose of the present invention, as embodied and broadly described, a TFT array substrate includes a gate line, a gate electrode, and a gate pad on a substrate, each of which including stacked layers of a first metal and a transparent conductive material, a pixel electrode of the transparent conductive material, a gate insulation layer on the substrate including the gate line and the gate electrode, the gate insulation layer having first and second open areas exposing the pixel electrode and the gate pad, a semiconductor layer on the gate insulation layer, a data line crossing the gate line to define a sub-pixel region, a source electrode diverging from the data line, a drain electrode spaced apart from the source electrode and connected to the pixel electrode, a data pad at an end of the data line; a masking layer covering the data line, the source electrode and the drain electrode, and an oxidation-prevention layer covering the gate pad and the data pad.

In another aspect, a method for fabricating a TFT array substrate includes sequentially depositing and patterning a first metal layer and a transparent conductive layer on a substrate to form a gate line, a gate electrode, a gate pad and a pixel electrode, depositing a insulation layer, an amorphous silicon layer and a second metal layer on the substrate, forming open areas by removing the staked layers of the insulation layer, the amorphous silicon layer and the second metal layer on the pixel electrode and the gate pad, patterning the amorphous silicon layer and the second metal layer to form a semiconductor layer, a data line, source and drain electrodes, and a data pad, forming masking layers on the data line and source and drain electrodes, respectively, and oxidation-prevention layers on the gate and data pads, and etching the second metal layer exposed between the masking layers to define a channel region according as the source and drain electrodes separate from each other, and etching the first metal layer of the pixel electrode exposed through the first open area.

In another aspect, a method for fabricating a TFT array substrate includes depositing sequentially on a substrate and patterning a first metal layer and a transparent conductive layer to form a gate line, a gate electrode, a gate pad, a common line and a common electrode on the substrate, stacking an amorphous silicon layer stacked on a second metal layer on the substrate including the gate line, the gate electrode, the gate pad, the common line and common electrode, forming open areas by removing the staked layers of the amorphous silicon layer and the second metal layer on the pixel electrode and the gate pad, forming a semiconductor layer, a data line, source and drain electrodes, and a data pad by patterning the amorphous silicon layer and the second metal layer, forming masking layers on the data line, source and drain electrodes, and oxidation-prevention layers on the gate and data pads, forming a pixel electrode as one body with the masking layer covering the drain electrode, and in parallel to the common electrode, etching the second metal layer exposed between the masking layers to define a channel region according as the source and drain electrodes separate from each other, and etching the first metal layer of the common electrode exposed in the first open area.

Both the foregoing general description and the following detailed description of embodiments of the invention are exemplary and explanatory and are intended to provide further explanation of the invention as claimed.

BRIEF DESCRIPTION OF THE DRAWINGS

The accompanying drawings, which are included to provide a further understanding of the present invention and are incorporated in and constitute a part of this application, illustrate embodiments of the present invention and together with the description serve to explain the principle of embodiments of the present invention. In the drawings.

DETAILED DESCRIPTION OF EXEMPLARY EMBODIMENTS

Reference will now be made in detail to exemplary embodiments of the present invention, which are illustrated in the accompanying drawings. Wherever possible, the same reference numbers will be used throughout the drawings to refer to the same or like parts.

Figure 1A:
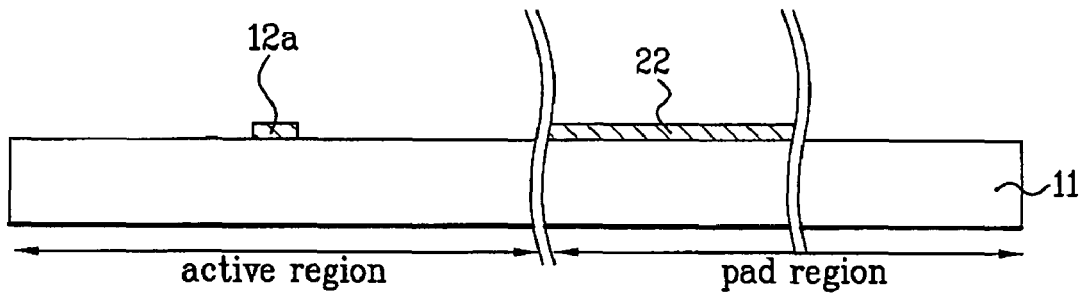
FIGS. 1A to 1E show cross-sectional views of a process of fabricating a TFT array substrate according to the related art.
Figure 1B:
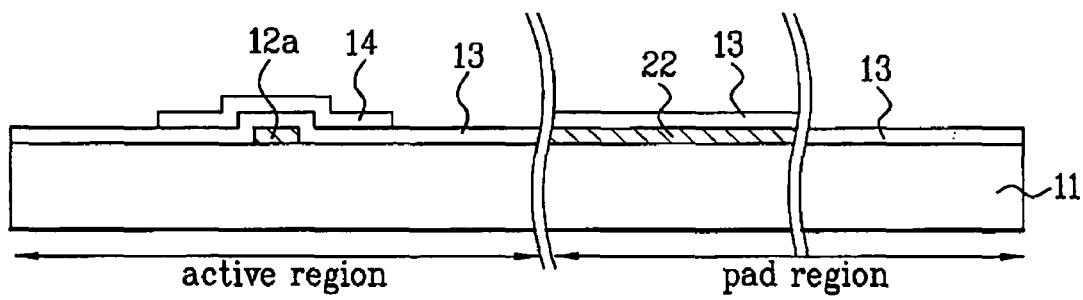
Figure 1C:
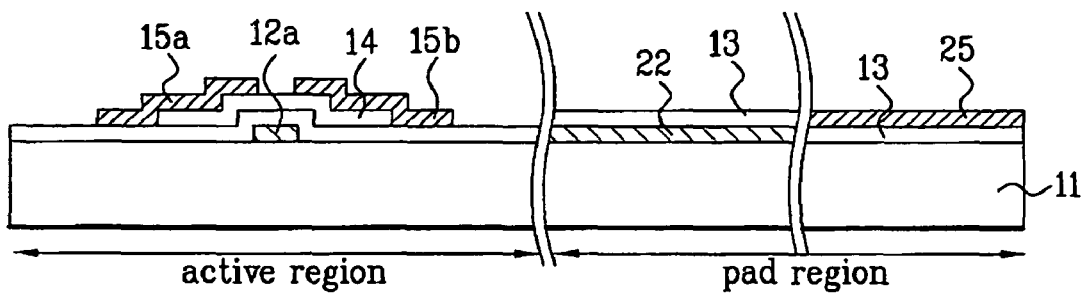
Figure 1D:
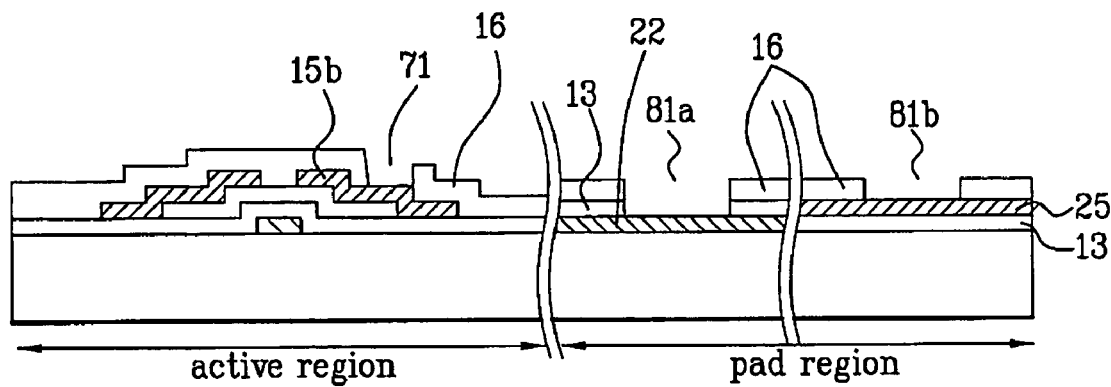
Figure 1E:
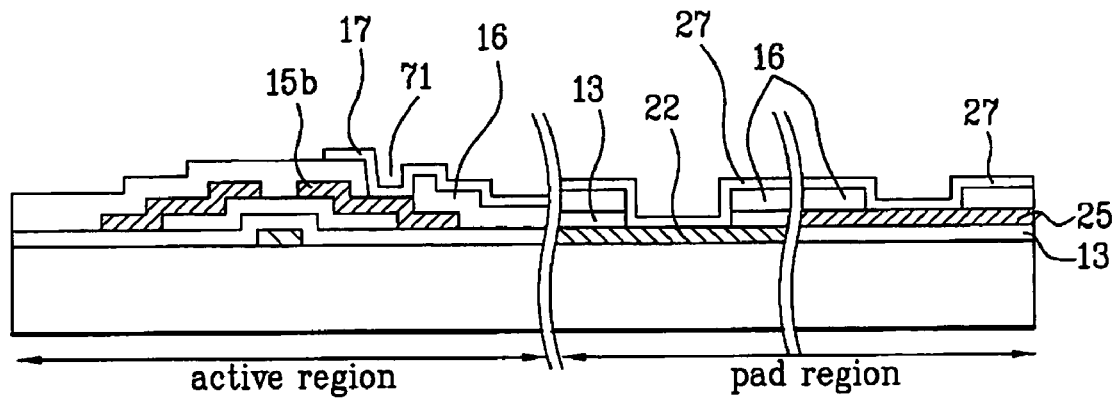
Figure 2:
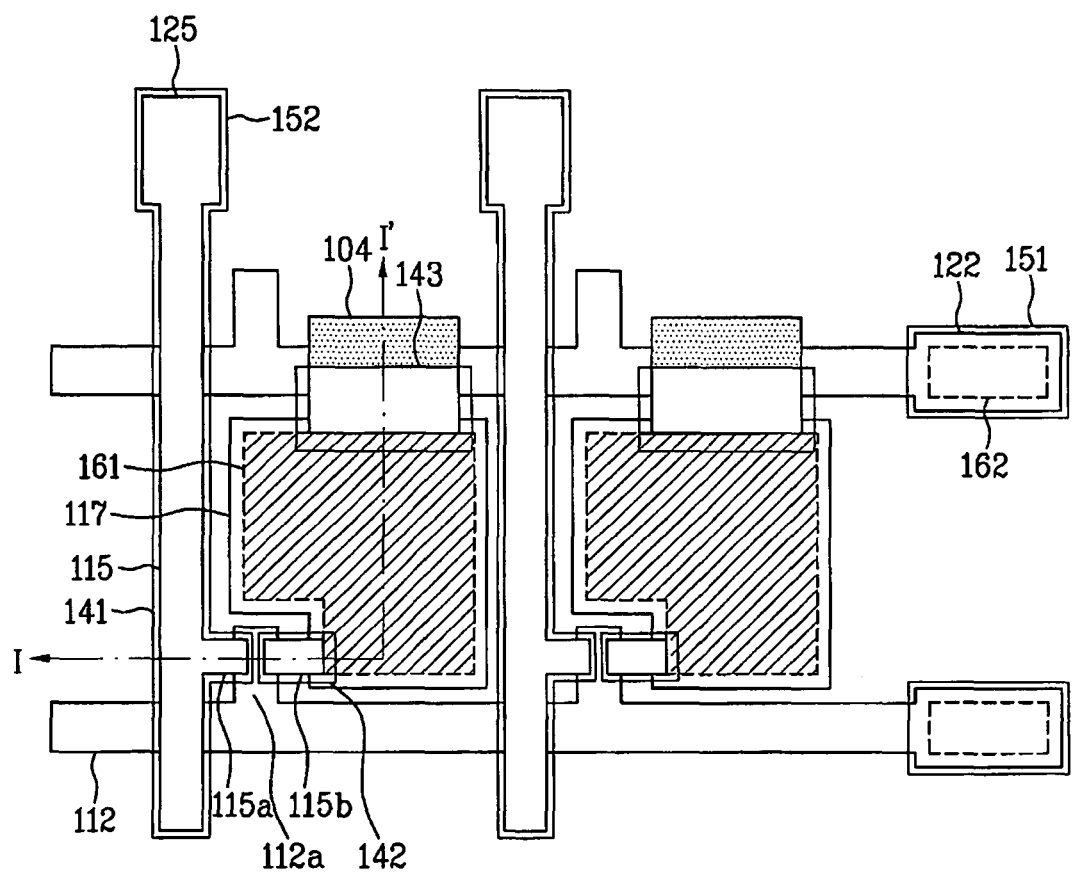
FIG. 2 shows a plane view of an exemplary TFT array substrate according to a first embodiment of the present invention.
Figure 3:
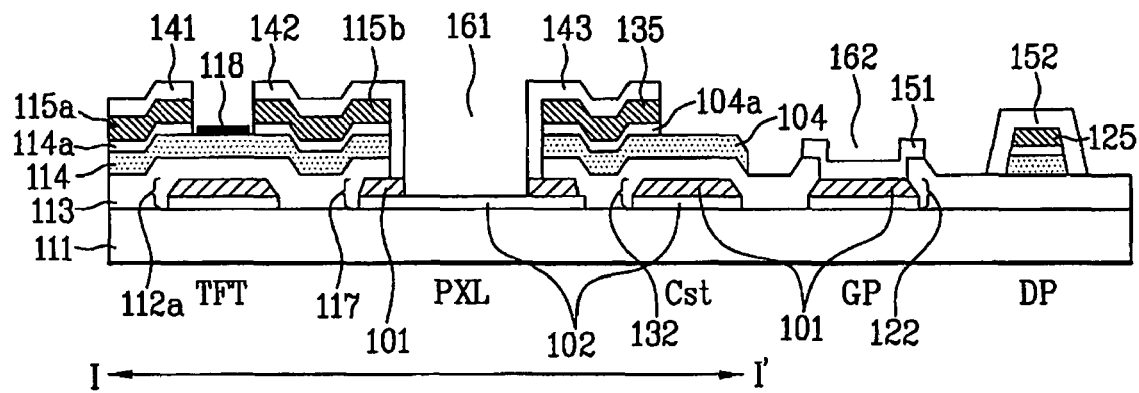
FIG. 3 shows an exemplary cross-sectional view along line I-I' of the TFT array substrate of FIG. 2.

FIG. 2 shows a plane view of an exemplary TFT array substrate according to a first embodiment of the present invention. FIG. 3 shows an exemplary cross-sectional view along line I-I' of the TFT array substrate of FIG. 2. Referring to FIGS. 2 and 3, the TFT array substrate for the LCD device includes an active region and a pad region. The active region includes a pixel electrode 117 and a TFT. The pad region includes a gate pad (GP) 122 and a data pad (DP) 125. The LCD device may operate in a TN mode.

The active region includes a gate line 112 and a gate electrode 112a which are integrally formed as one body; a pixel electrode 117 which is formed on the same layer as the gate line 112, and is formed in the entire portion of a sub-pixel region; a gate insulation layer 113 having a first open area 161 to expose the pixel electrode 117; a data line 115 crossing the gate line 112 to define the sub-pixel region, and is formed on the gate insulation layer 113; a source electrode 115a diverging from the data line 115; a drain electrode 115b spaced apart from the source electrode 115a; and masking layers 141 and 142 which cover the data line 115, the source electrode 115a and the drain electrode 115b.

The sub-pixel region is defined by the crossing of the gate line 112 with the data line 115, which may be perpendicular to each other. Also, a TFT is formed adjacent to the crossing of the gate and data lines 112 and 115 to include the gate electrode 112a, the gate insulation layer 113, a semiconductor layer 114, an ohmic contact layer 114a, and the source and drain electrodes 115a and 115b.

Then, a passivation layer 118 is formed on a channel region of the semiconductor layer 114 between the source and drain electrodes 115a and 115b, wherein the passivation layer 118 is formed of a thin film treated with O2 plasma. The passivation layer 118 blocks external light to prevent an undesired optical-current flow in the channel region.

The pad region includes the gate pad 122 which transmits a scanning signal and extends from the gate line 112; and the data pad 125 which transmits a video signal and extends from the data line 115. Also, the gate and data pads 122 and 125 are respectively covered with first and second oxidation-prevention layers 151 and 152. The gate pad 122 is in contact with the first oxidation-prevention layer through a second open area 162 formed by removing a portion of the gate insulation layer 113 in the gate pad area.

Each of the gate line 112, the gate electrode 112a, and the gate pad 122 is formed of a stacked layer of a transparent conductive layer 102 and a first metal layer 101. The pixel electrode 117 includes only the transparent conductive layer 102. Each of the data line 115, the source and drain electrodes 115a and 115b, and the data pad 125 is formed of a second metal layer. The first and second metal layers may include copper (Cu), copper alloy (Cu Alloy), aluminum (Al), aluminum neodymium (AlNd), molybdenum (Mo), molybdenum alloy (Mo Alloy), chrome (Cr), chrome alloy (Cr Alloy), titanium alloy (Ti Alloy), argentum (Ag), or argentum alloy (Ag Alloy).

The masking layer includes the first masking layer 141 covering the data line 115 and the source electrode 115a and the second masking layer 142 covering the drain electrode 115b. Through the use of the second masking layer, the drain electrode 115b and the pixel electrode 116 are electrically connected to each other even though they are formed on the different layers.

The oxidation-prevention layer includes the first oxidation-prevention layer 151 which covers the gate pad 122 through the second open area 162; and the second oxidation-prevention layer 152 which covers the data pad 125.

The first and second masking layers 141 and 142 are formed on the same layer as the first and second oxidation-prevention layers 151 and 152. Also, the first masking layer 141 which covers the data line is integrally formed as one body with the second oxidation-prevention layer 152 which covers the data pad 125 since the data line 115 is integrally formed with the data pad 125.

The masking layer electrically connects the two patterns which are formed on the different layers, for example, drain electrode and pixel electrode, so that the masking layer is formed of the material having the conductive property. To prevent the gate and data pads from being oxidized, the oxidation-prevention layer is formed of a material having corrosion-resistance and oxidation-resistance. In this respect, the masking layer and oxidation-prevention layer may be formed of a transparent conductive material of ITO or IZO, or may be formed of a metal layer of titanium (Ti) or Ti alloy.

Then, a lower capacitor electrode 132 is formed on the same layer as the gate line 112. Also, an upper capacitor electrode 135 is formed on the same layer as the data line 115, and is overlapped with the lower capacitor electrode 132. Thus, a storage capacitor Cst is formed by the lower and upper capacitor electrodes overlapping each other with the gate insulation layer 113 therebetween.

Then, a third masking layer 143 is formed on the upper capacitor electrode 135, wherein the upper capacitor electrode 135 is electrically connected with the pixel electrode 117 through the third masking layer 143. The third masking layer 143 is formed on the same layer as the first and second masking layers 141 and 142, and is formed of the same material as the first and second masking layers 141 and 142.

In an embodiment, an amorphous silicon layer is formed below the data line 115, the source and drain electrodes 115a and 115b, the data pad 125, and the upper capacitor electrode 135. In this case, a pattern of the amorphous silicon layer is the same as those of the data line 115 and the data pad 125 except for the source and drain electrodes 115a and 115b and the upper capacitor electrode 135. This is possible because the second metal layer for the data line material and the amorphous silicon layer are patterned at the same time by using a diffraction exposure mask.

Then, an n+a-Si layer 104a is formed between the second metal layer and the amorphous silicon layer 104 in the same patterns with the data line 115, the source and drain electrodes 115a and 115b, the data pad 125, and the upper capacitor electrode 135. The amorphous silicon layer of the thin film transistor functions as the semiconductor layer 114, and the n+a-Si layer functions as the ohmic contact layer 114a.

Although not shown, the TFT array substrate including the pixel electrode 117 and the TFT is bonded to an opposing substrate including a common electrode (not shown) and a color filter layer. Then, a liquid crystal layer is formed between the two opposing substrates, thereby completing an LCD device. In this case, the liquid crystal layer is driven by a vertical electric field formed between the pixel electrode 117 and the common electrode. Thus, the LCD device may operate in a TN mode.

Figure 4A:
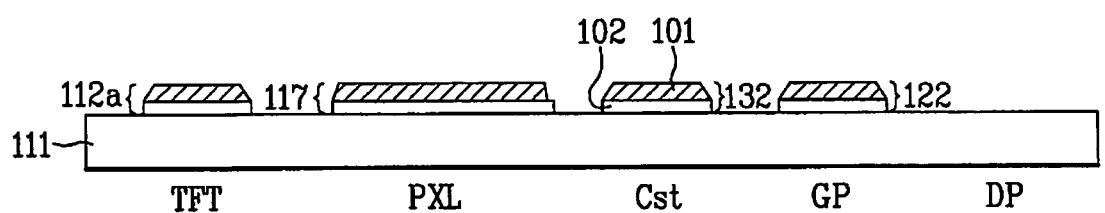
FIGS. 4A to 4H show cross-sectional views of exemplary steps for fabricating the TFT array substrate of FIGS. 2 and 3.

FIGS. 4A to 4H show cross-sectional views of exemplary steps for fabricating the TFT array substrate of FIGS. 2 and 3. FIGS. 5A to 5D show plane views of the exemplary steps for fabricating the TFT array substrate corresponding to FIGS. 4A, 4E, 4F and 4G, respectively. First, as shown in FIGS. 4A and 5A, the transparent conductive layer 102 is formed on a transparent substrate 111 having a good heat-resistance. Then, the first metal layer 101 is deposited on the transparent conductive layer 102 by sputtering, and is then patterned by photolithography using a first exposure mask, thereby forming the gate line 112, the gate electrode 112a of the TFT region diverging from the gate line 112, the lower capacitor electrode 132 of the storage capacitor region Cst, and the gate pad 122 of the gate pad region GP. In this case, the transparent conductive layer 102 may be formed of ITO (Indium Tin Oxide), IZO (Indium Zinc Oxide), AZO, or ZnO. And, the first metal layer 101 may be formed of copper (Cu), copper alloy (Cu Alloy), aluminum (Al), aluminum neodymium (AlNd), molybdenum (Mo), molybdenum alloy (Mo Alloy), chrome (Cr), chrome alloy (Cr Alloy), titanium (Ti), titanium alloy (Ti Alloy), argentum (Ag), or argentum alloy (Ag Alloy). In an embodiment, the first metal layer 101 is formed of a stacked layer of Mo/AlNd.

A wet etching may be used to etch the first metal layer 101 and the transparent conductive layer 102 together. Then, the lower capacitor electrode 132 and the gate line 112 may be formed separately. However, as shown in FIG. 5A, it is possible that portions of the gate line 112 function as the lower capacitor electrode 132.

Figure 4B:
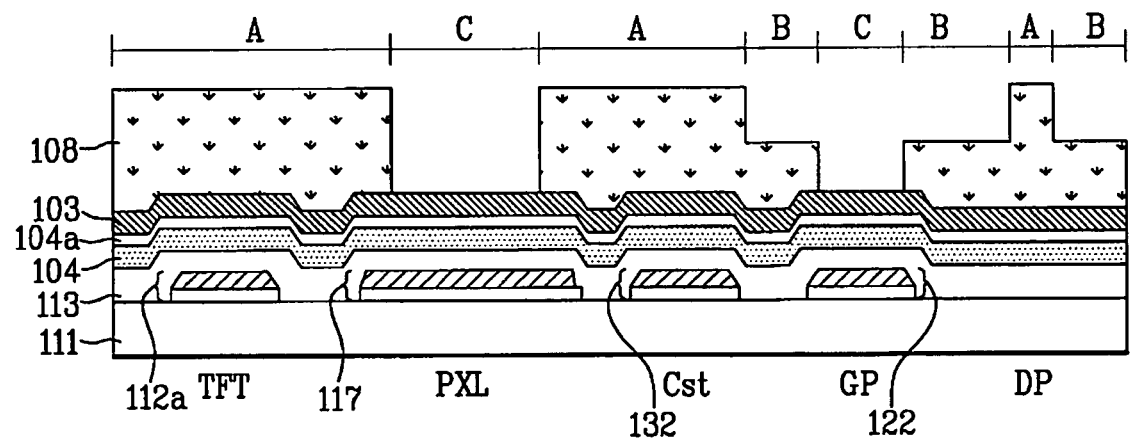
Figure 5A:
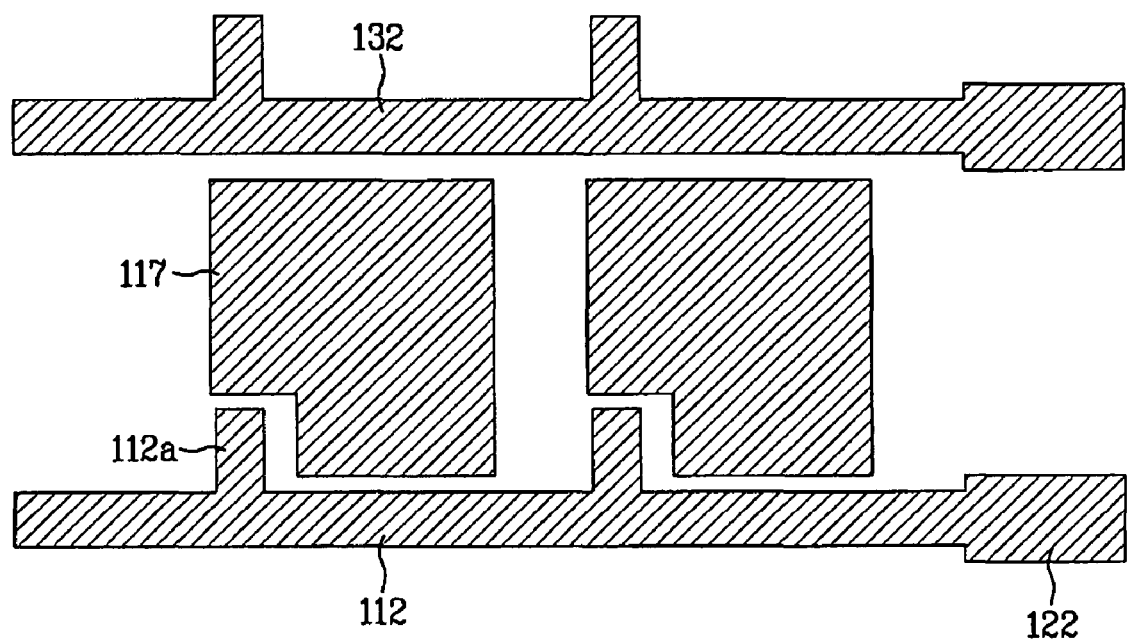
FIGS. 5A to 5D show plane views of the exemplary steps for fabricating the TFT array substrate corresponding to FIGS. 4A, 4E, 4F and 4G, respectively.

As shown in FIG. 4B, an inorganic material of silicon nitride (SiNx) or silicon oxide (SiOx) is deposited on the entire surface of the transparent substrate 111 including the gate electrode 112a at high temperature to form the gate insulation layer 113.

Subsequently, amorphous silicon (a-Si) 104 and amorphous silicon doped with impurity ions (n+a-Si) 104a are sequentially formed on the gate insulation layer 113. Thereon, the second metal layer 103 is formed by sputtering. The second metal layer 103 may be formed of copper (Cu), copper alloy (Cu Alloy), aluminum (Al), aluminum neodymium (AlNd), molybdenum (Mo), molybdenum alloy (Mo Alloy), chrome (Cr), chrome alloy (Cr Alloy), titanium (Ti), titanium alloy (Ti Alloy), argentum (Ag), or argentum alloy (Ag Alloy). Then, the (a-Si) layer 104 may be formed at a thickness of about 1700 Å, the (n+a-Si) layer 104a may be formed at a thickness of about 300 Å, and the second metal layer 103 may be formed at a thickness of about 2000 Å.

Then, the stacked layer including the gate insulation layer 113, the amorphous silicon 104, the n+a-Si 104a, and the second metal layer 103 is selectively patterned by photolithography using a second exposure mask. For example, a photoresist 108 of UV-curable resin is coated by a spinning method or a roll-coating method on the second metal layer 103. The photoresist 108 is covered with the second exposure mask (not shown) having a predetermined pattern therein. Then, the photoresist 108 covered with the second exposure mask is exposed to UV-ray or X-ray. The exposed photoresist is developed to form a photoresist pattern having the step coverage.

In an embodiment, the second exposure mask may be a diffraction exposure mask. To form the diffraction exposure mask, a light-shielding layer of a metal material and a semi-transparent layer are formed on a transparent substrate. Thus, the diffraction exposure mask includes three regions corresponding to a transparent region, a semi-transparent region, and a light-shielding region. The transparent region has the light transmittance of 100%, the light-shielding region has the light transmittance of 0%, and the semi-transparent region has the light transmittance between 0% and 100%. After applying the diffraction exposure to the photoresist, the photoresist 108 is divided into three regions: region C is aligned with the transparent region of the diffraction exposure mask and is completely removed after the development process, region (A) is aligned with the light-shielding region of the diffraction exposure mask and is not removed from the alignment process, and region (B) which is aligned with the semi-transparent region of the diffraction exposure mask and has a predetermined thickness. In an embodiment, the photoresist is formed of a positive type, wherein the predetermined portion exposed to the light is removed. In another embodiment, the photoresist is of a negative type and a predetermined portion unexposed to the light is removed.

After the diffraction exposure and development process, the photoresist 108 has the step coverage, as described above. The region (A) corresponds to portions for forming the data line, the source and drain electrodes, the upper capacitor electrode and the data pad. The region (C) corresponds to portions for forming the pixel electrode and the gate pad. The region (B) corresponds to the remaining portions.

Figure 4C:
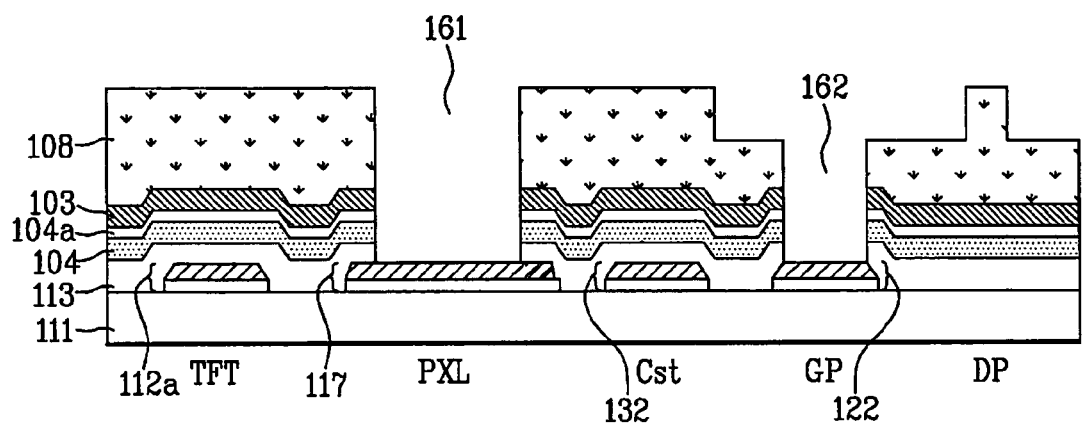

As shown in FIG. 4C, the gate insulation layer 113, the amorphous silicon 104, the n+a-Si 104a, and the second metal layer 103 are etched together using the photoresist 108 having the step coverage as a mask, thereby forming the first and second open areas 161 and 162 to expose portions of the pixel electrode 117 and the gate pad 122, respectively. In this case, the first open area 161 is smaller in size than the pixel electrode 117, and the second open area 162 is smaller in size than the gate pad 122. Thus, the stacked layer of the amorphous silicon 140, the n+a-Si 104a, and the second metal layer 103 are overlapped with the corners of the pixel electrode 117 and the gate pad 122.

The gate insulation layer 113, the amorphous silicon 104, the n+a-Si 104a, and the second metal layer 103 may be etched together in one dry-etching chamber. In an embodiment, different kinds of etching gases are provided. First, SF6, Cl2 or O2 may be used for etching the second metal layer 103 (Mo). SF6, Cl2 or H2 may be used for etching the amorphous silicon 104. SF6, O2 or He may be used for etching the gate insulation layer 113.

Figure 4D:
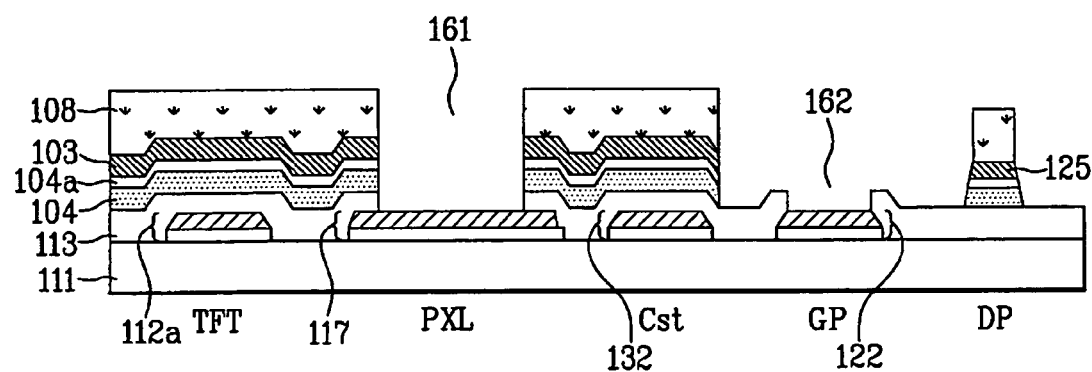

As shown in FIG. 4D, the photoresist 108 is ashed until thinner portions thereof around the gate pad and the data pad areas is completely removed, exposing portions of the amorphous silicon 104, the n+a-Si 104a, and the second metal layer 103 in the region B. Then, the exposed portions of the amorphous silicon 104, the n+a-Si 104a, and the second metal layer 103 in the region B are etched one at a time leaving the gate insulation layer 113. In an embodiment, a dry-etching process is performed such that the etching gas for the gate insulation layer 113 is different in etching-selection ratio from the etching gases for the other-material layers. Thus, portions of the gate insulation layer 113 are removed from the first and second open areas 161 and 162, and other portions of the gate insulation layer 113 are left to protect the gate line layer 112.

Figure 4E:
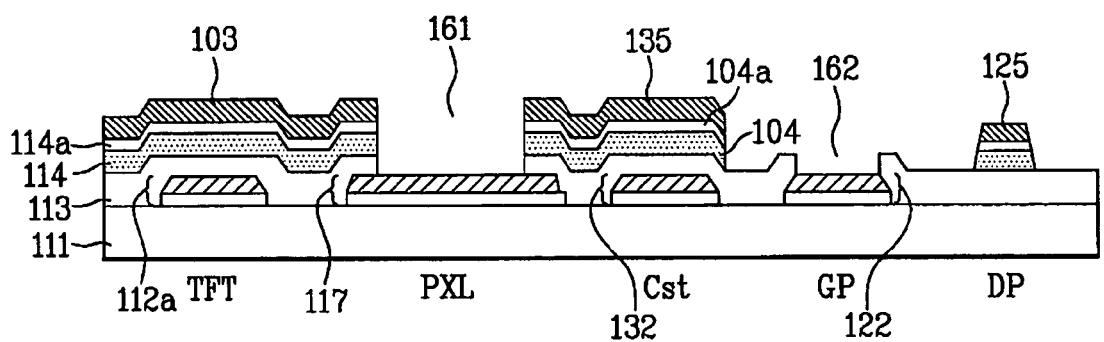
Figure 5B:
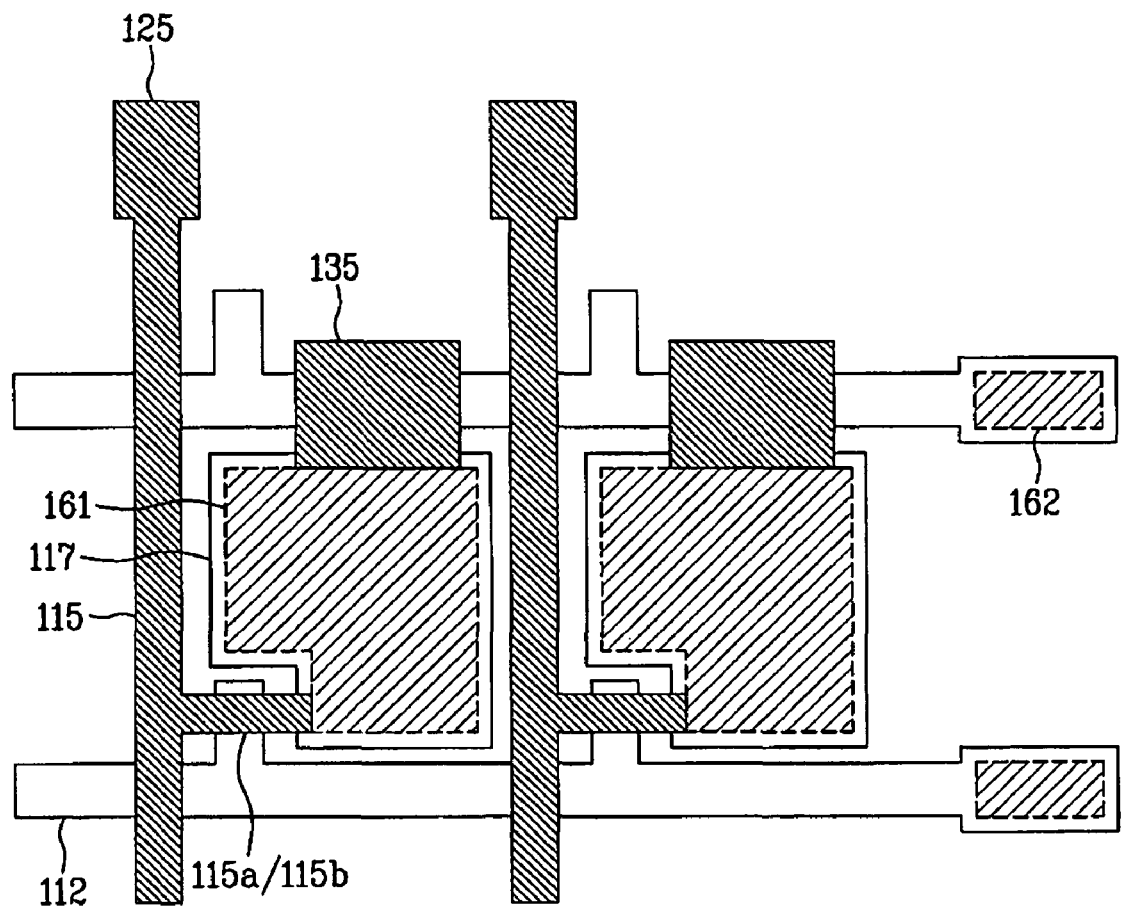

As shown in FIGS. 4E and 5B, the remaining portion of the photoresist 108 is completely removed to complete the data line 115, the stacked layer of the semiconductor layer 114, the ohmic contact layer 114a, and exposed portions of the second metal layer 103 covering the TFT region, the upper capacitor electrode 135 of the storage capacitor region (Cst), the data pad 125 of the data pad region (DP), the first open areas 161 exposing the pixel electrode 117, and the second open areas 162 exposing the gate pad 122.

Figure 4F:
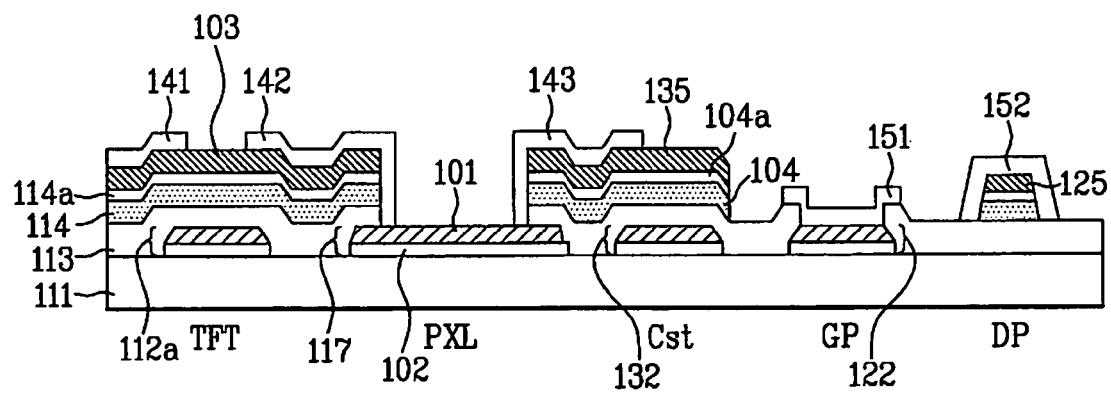
Figure 5C:
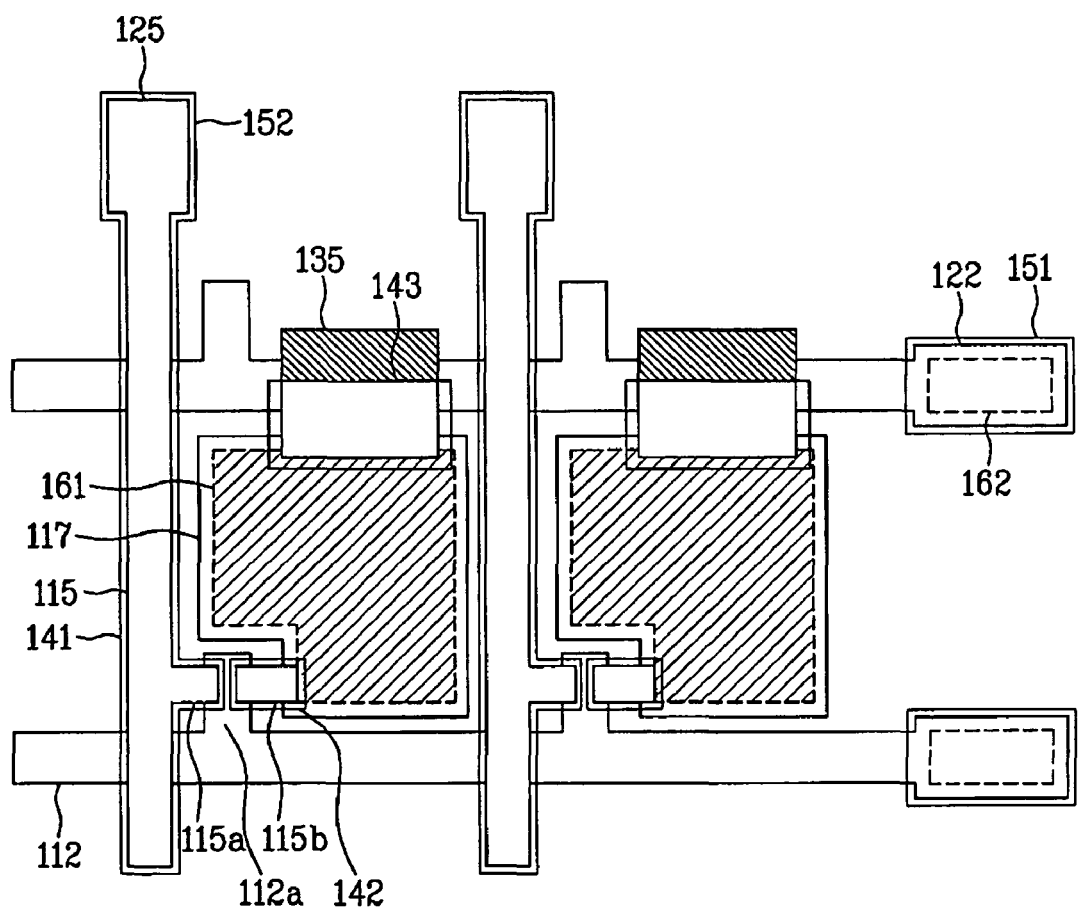

As shown in FIGS. 4F and 5C, a conductive material is deposited on the entire surface of the substrate 111, and is then patterned by photolithography using a third exposure mask to form the first, second and third masking layers 141, 142, 143, and the first and second oxidation-prevention layers 151 and 152. The conductive material may be formed of a transparent conductive material such as ITO (Indium Tin Oxide), IZO (Indium Zinc Oxide), AZO or ZnO, or may be formed of a metal layer of Ti or Ti alloy which is not easily oxidized or eroded.

The first masking layer 141 covers the data line 115 and a first portion of the second metal layer 103 in the TFT region. The second masking layer 142 covers a second portion of the second metal layer 103 in the TFT region, and is also in contact with the first metal layer 101 of the pixel electrode 117. A third portion of the second metal layer 103 remains exposed between the first and second masking layers 141 and 142 in the TFT region.

The third masking layer 143 covers portions of the upper capacitor electrode 135, and is also in contact with the first metal layer 101 of the pixel electrode 117. The upper capacitor electrode 135 etched by the third masking layer is prevented from being short-circuited with the pixel electrode 117 of the adjacent sub-pixel region, by covering a portion of the upper capacitor electrode 135 with the third masking layer 143.

The first and second oxidation-prevention layers 151 and 152 respectively cover the gate pad 122 and the data pad 125. The first and second oxidation-prevention layers 151 and 152 prevent the gate and data pads 122 and 125 from being oxidized, and improve the contact property between the gate and data pads 122 and 125 and an external driving circuit. Then, the second oxidation-prevention layer 152 is integrally formed as one body with the first masking layer 141 to prevent the data line 115 from being opened in the following process.

Figure 4G:
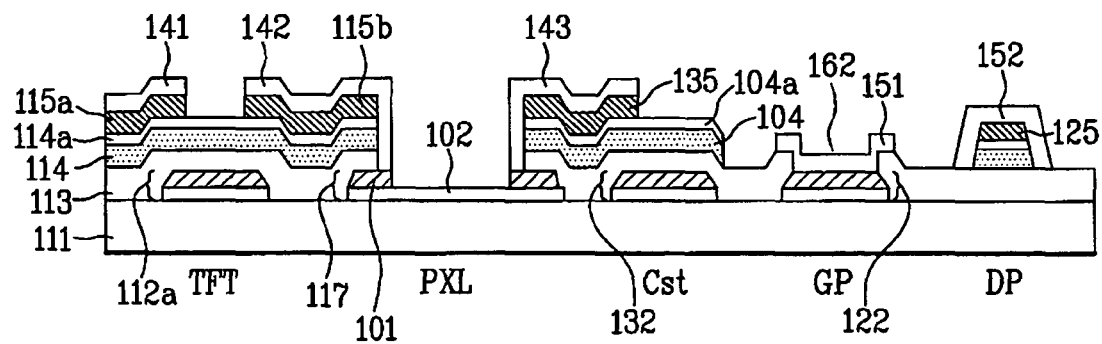
Figure 5D:
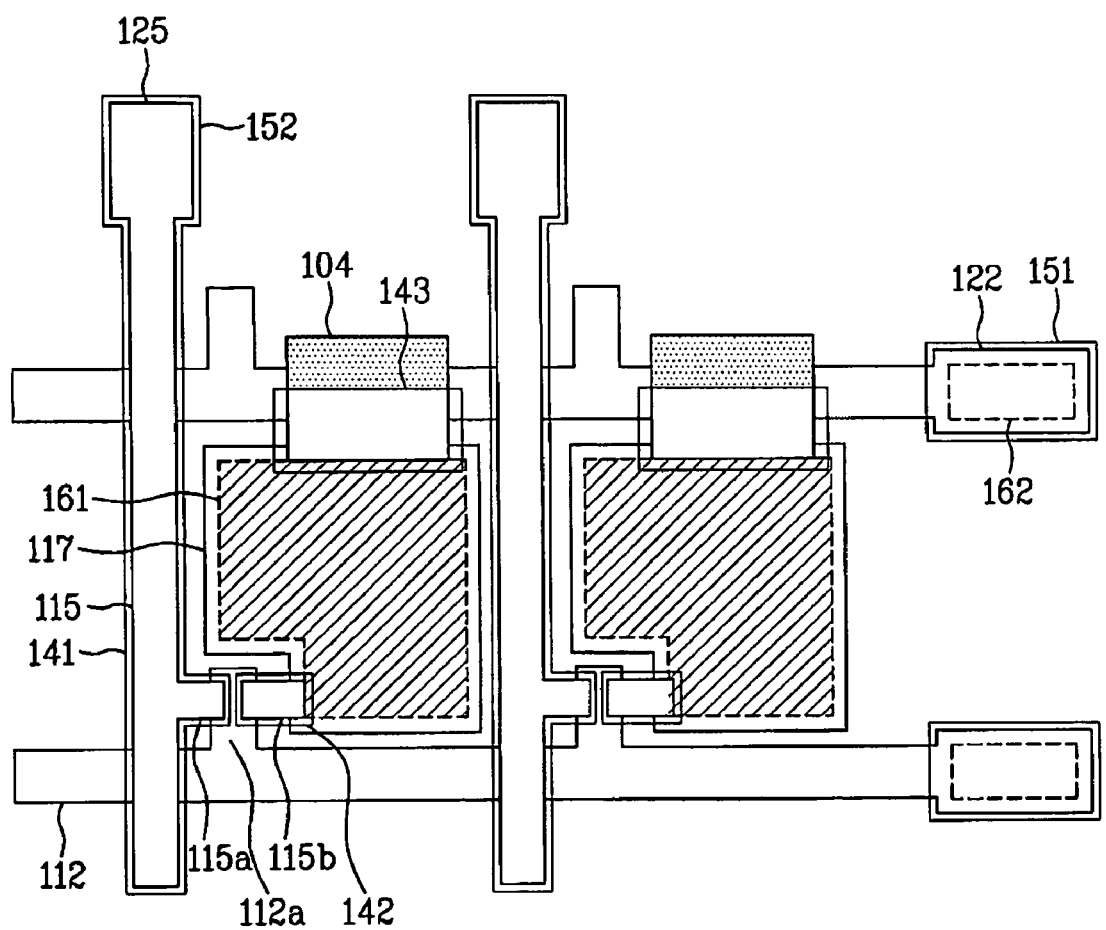

As shown in FIGS. 4G and 5D, the exposed portions of the first metal layer 101, the second metal layer 103, and the upper capacitor electrode 135 are selectively wet-etched using the first, second and third masking layers 141, 142 and 143 as a mask. Phosphoric acid, acetic acid or nitric acid based material may be used as etchant for the wet-etching process.

If a dry-etching process is used, the second metal layer of Mo is etched, but the first metal layer 101 of Mo/AlNd is not etched due to the AlNd material. In this respect, the wet-etching process is applied. The dry-etching process is not used in conjunction with a copper layer, since copper is not etched by the dry-etching process.

Accordingly, by etching the second metal layer 103 in the TFT region, a source electrode 115*a* and a drain electrode 115*b* are formed under the first and second masking layers 141 and 142 in the TFT region with a channel region between the source and drain electrodes 115*a* and 115*b*. Similarly, portions of the upper capacitor electrode 135 are removed from the storage capacitor region, and the exposed portion of the first metal layer 101 on the pixel electrode is also etched. Accordingly, the pixel electrode 117 includes only the first transparent conductive layer 102. As mentioned above, the portions of the upper capacitor electrode 135 are removed to prevent the upper capacitor electrode 135 from being short-circuited with the pixel electrode of the adjacent sub-pixel region. Also, since the amorphous silicon 104 is sufficiently overlapped with the lower capacitor electrode 132, sufficient storage capacitance will be provided.

Figure 4H:
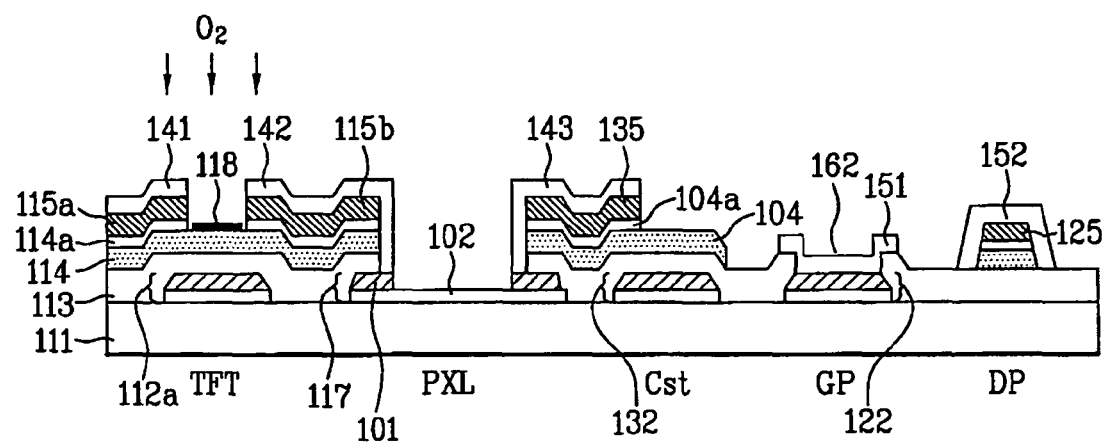

As shown in FIG. 4H, the ohmic contact layer (n+a-Si) 114*a* is dry-etched between the source and drain electrode 115*a* and 115*b*. The surface of the dry-etched ohmic contact layer is treated with O2 plasma to form a passivation layer 118 in the channel region. By the surface treatment with O2 plasma, the channel region of the semiconductor layer is protected from undesired optical-current, thereby preventing deterioration of the TFT. Then, the exposed portion of the n+a-Si layer 104*a* of the storage capacitor region (Cst) is also etched.

In accordance with an embodiment of the invention, the TFT array substrate can be fabricated with only three exposure masks. Thus, the number of masks is reduced, thereby reducing manufacturing time and cost.

In accordance with an embodiment of the invention, a TFT array substrate for a TN mode LCD device can be fabricated with only three exposure masks.

Figure 6:
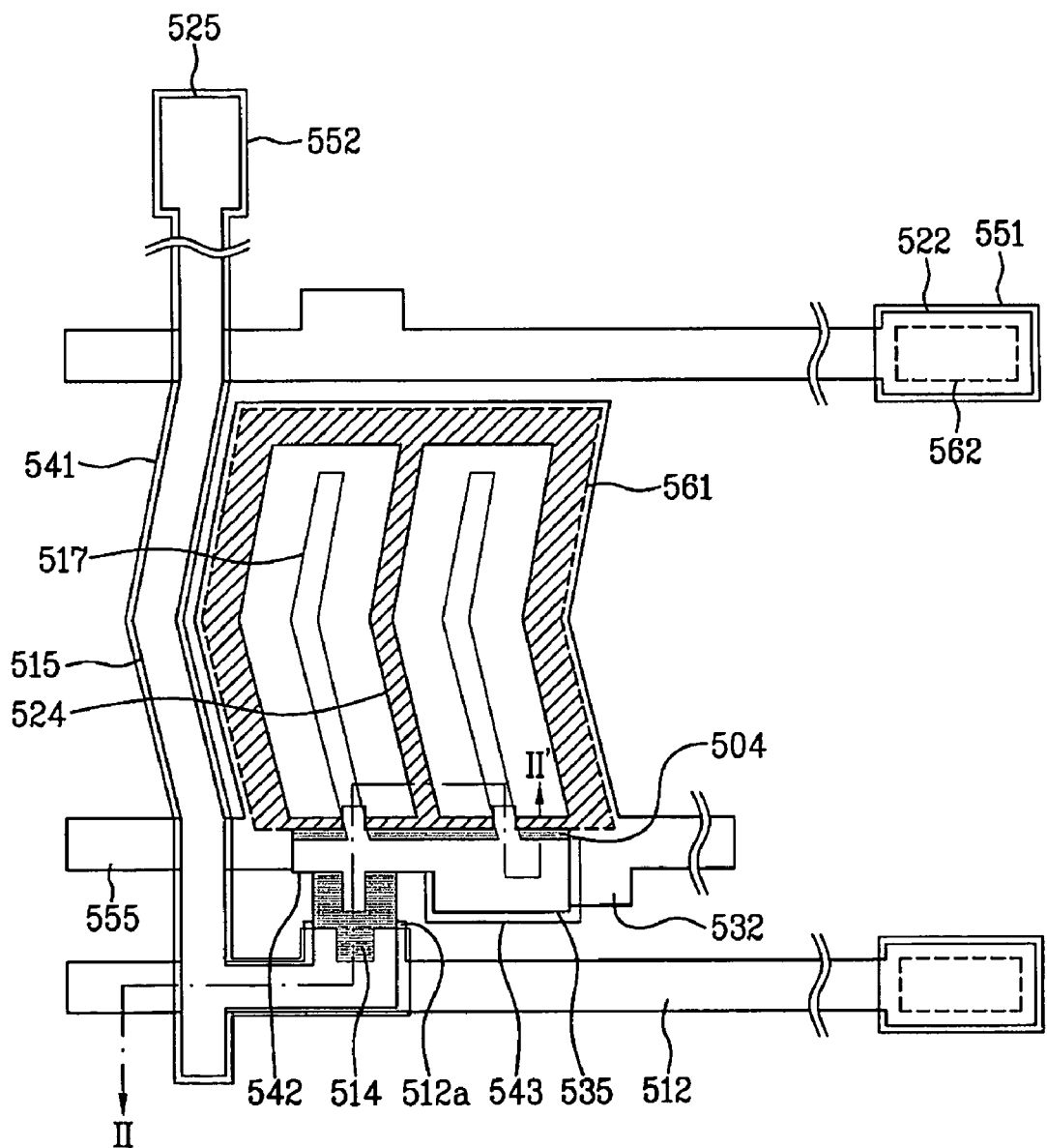
FIG. 6 shows a plane view of an exemplary TFT array substrate for an IPS mode LCD device according to a second embodiment of the invention.
Figure 7:
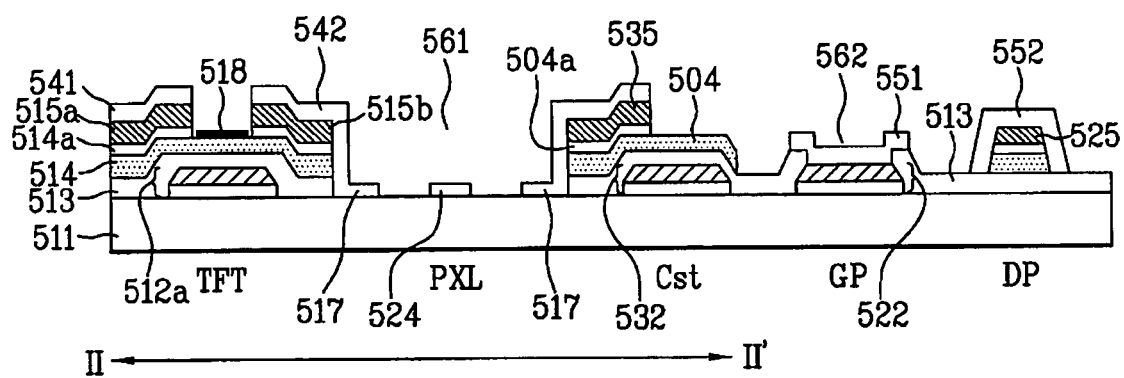
FIG. 7 shows an exemplary cross-sectional view along line II-II' of FIG. 6.

FIG. 6 shows a plane view of an exemplary TFT array substrate for an IPS mode LCD device according to a second embodiment of the invention. FIG. 7 shows an exemplary cross-sectional view along line II-II' of FIG. 6. Referring to FIGS. 6 and 7, the TFT array substrate includes an active region provided with a pixel electrode 517 and a thin film transistor (TFT), and a pad region provided with a gate pad (GP) 522 and a data pad (DP) 525.

The active region includes a gate line 512 and a gate electrode 512*a* which are integrally formed as one body on a substrate 511; a common line 555 which is formed on the same layer as the gate line 512 in parallel; a plurality of common electrodes 524 diverging from the common line 555; a gate insulation layer 513 which has a first open area 561 exposing a sub-pixel region provided with the common electrode 524; a data line 515 crossing the gate line on the gate insulation layer 513 to thereby define a sub-pixel region; a source electrode 515*a* diverging from the data line; a drain electrode 515*b* which is formed at a predetermined interval from the source electrode; masking layers 541 and 542 which cover the data line 515, the source electrode 515*a* and the drain electrode 515*b* provided on the same layer; and the pixel electrode 517 which is in contact with the drain electrode 515*b*, and is parallel to the common electrode 524 in the opening of the sub-pixel region to thereby form a horizontal electric field.

Then, the sub-pixel region is defined by crossings of the gate and data lines 512 and 515. Then, the TFT is formed adjacent to a crossing of the gate and data lines. The TFT is formed of a stacked layer of the gate electrode 512*a*, the gate insulation layer 513, a semiconductor layer 514, an ohmic contact layer 514*a*, and the source and drain electrodes 515*a* and 515*b*. In case of a channel region corresponding to the semiconductor layer between the source and drain electrodes 515*a* and 515*b*, the surface of the semiconductor layer is treated with O2 plasma, whereby a passivation layer 518 is thinly formed therein. The passivation layer 518 blocks external light from accessing the channel region of the TFT. Thus, it is possible to prevent an undesired optical-current from occurring in the channel region.

The pad region includes the gate pad 522 which transmits a scanning signal and extends from the gate line 512; and the data pad 525 which transmits a video signal and extends from the data line 515. Also, the gate and data pads are respectively covered with first and second oxidation-prevention layers 551 and 552. The gate pad 522 is in contact with the first oxidation-prevention layer 551 through the second open area 562 which is formed by removing the gate insulation layer 513.

Then, each of the gate line 512, the gate electrode 512*a*, the gate pad 522, and the common line 555 is formed of a stacked layer of a transparent conductive layer 502 and a first metal layer 501. The common electrode 524 provided in the sub-pixel region is formed of only the transparent conductive layer 502. In case of the pixel electrode which is parallel to the common electrode 524 in the sub-pixel region, the pixel electrode 517 is formed of the transparent conductive material, and is formed on the same layer as the masking layer.

Each of the data line 515, the source and drain electrodes 515*a* and 515*b*, and the data pad 525 is formed of a second metal layer. The first and second metal layers may include copper (Cu), copper alloy (Cu Alloy), aluminum (Al), aluminum neodymium (AlNd), molybdenum (Mo), molybdenum alloy (Mo Alloy), chrome (Cr), chrome alloy (Cr Alloy), titanium (Ti), titanium alloy (Ti Alloy), argentum (Ag), or argentum alloy (Ag Alloy).

The masking layer is comprised of the first masking layer 541 which is formed on the data line 515 and the source electrode 515*a*; and the second masking layer 542 which is formed on the drain electrode 515*b*. According as the second masking layer 542 is formed in the extending shape, the extending portion of the second masking layer 542 functions as the pixel electrode 517 which is parallel to the common electrode 524. The oxidation-prevention layer is comprised of the first oxidation-prevention layer 551 which covers the gate pad 522 through the use of the second open area 562; and the second oxidation-prevention layer 552 which covers the data pad 525.

Then, the first and second masking layers 541 and 542 are formed on the same layer as the first and second oxidation-prevention layers 551 and 552 and the pixel electrode 517. The first masking layer 541 which covers the data line 515 is integrally formed as one body with the second oxidation-prevention layer 552 which covers the data pad 525. The second masking layer 542 which covers the drain electrode 515*b* is integrally formed as one body with the pixel electrode 517.

The masking layer is formed of a material having the conductive property since the masking layer is integrally formed as one body with the pixel electrode. Also, the oxidation-prevention layer is formed of the material having the corrosion-resistance and oxidation-resistance, so as to prevent the gate and data pads from being oxidized. To meet these needs for the masking layer and the oxidation-prevention layer, the masking layer and the oxidation-prevention layer may be formed of the transparent conductive layer such as ITO (Indium Tin Oxide) or IZO (Indium Zinc Oxide), or may be formed of the metal layer of Ti or Ti alloy. If forming the masking layer and pixel electrode of the metal layers, the aperture ratio of device lowers. In this respect, it is preferable to form the masking layer and pixel electrode of the transparent conductive materials.

In addition, a lower capacitor electrode 532 is formed on the same layer as the gate line 512, and an upper capacitor electrode 535 is formed on the same layer as the data line 515. Then, the upper capacitor electrode 535 is formed on the lower capacitor electrode 532, and is overlapped with the lower capacitor electrode 532. Thus, a storage capacitor Cst is formed by the lower and upper capacitor electrodes 532 and 535 being overlapped with each other with the gate insulation layer 513 therebetween.

Then, a third masking layer 543 is formed on the upper capacitor electrode 535, wherein the third masking layer 543 of the extending shape is integrally formed as one body with the pixel electrode 517. The third masking layer 543 is formed on the same layer as the first and second masking layers 541 and 542, and is formed of the same material as the first and second masking layers 541 and 542. As shown in FIG. 6, if the drain electrode 515b is integrally formed as one body with the upper capacitor electrode 535, the second masking layer 542 for covering the above-mentioned patterns is also integrally formed as one body with the third masking layer 543. Eventually, the second and third masking layers 541 and 542 are integrally formed as one body with the pixel electrode 517.

An amorphous silicon layer (514/504) is additionally formed below the data line 515, the source and drain electrodes 515a and 515b, the data pad 525, and the upper capacitor electrode 535. In this case, a pattern of the amorphous silicon layer 514 is the same as those of the data line 515 and the data pad 525 except for the source and drain electrodes 515a and 515b and the upper capacitor electrode 535. This is possible because the second metal layer for the data line material and the amorphous silicon layer are formed at the same time by using a diffraction exposure mask.

Then, an n+a-Si layer 504a is formed between the second metal layer and the amorphous silicon layer in same patterns with the data line 515, the source and drain electrodes 515a and 515b, the data pad 525, and the upper capacitor electrode 535. The amorphous silicon layer of the thin film transistor functions as the semiconductor layer 514, and the n+a-Si layer 504a functions as the ohmic contact layer 514a.

Although not shown, the TFT array substrate including the common electrode 524, the pixel electrode 517 and the TFT is bonded to an opposing substrate including a color filter layer. Then, a liquid crystal layer is formed between the two opposing substrates, thereby completing an LCD device. In this case, the liquid crystal layer is driven by a horizontal electric field formed between the pixel electrode and the common electrode.

Figure 8A:
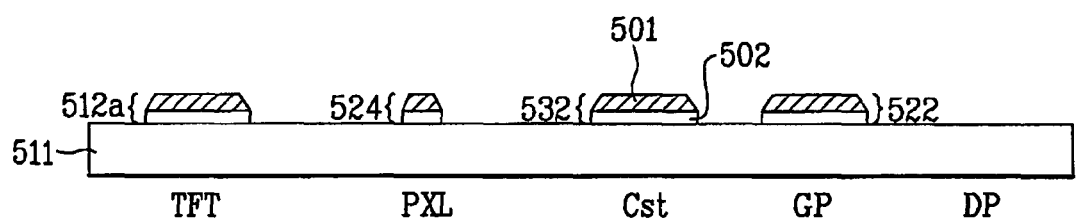
FIGS. 8A to 8H show cross-sectional views of exemplary steps for fabricating the TFT array substrate of FIGS. 6 and 7.

FIGS. 8A to 8H show cross-sectional views of exemplary steps for fabricating the TFT array substrate of FIGS. 6 and 7. FIGS. 9A to 9D show plane views of the exemplary steps for fabricating the TFT array substrate corresponding to FIGS. 8A, 8E, 8F and 8G, respectively. As shown in FIGS. 8A and 9A, a transparent conductive layer 502 is formed on the transparent substrate 511 having good heat-resistance. Then, the first metal layer 501 is deposited on the transparent conductive layer 502 by sputtering, and is then patterned by photolithography using a first exposure mask, thereby forming the gate line 512; the gate electrode 512a of the TFT region diverging from the gate line; the common line 555 parallel to the gate line 512; the plurality of common electrodes 524 diverging from the common line 555 and are formed in parallel to one another; the lower capacitor electrode 532 of the storage capacitor region (Cst); and the gate pad 522 of the gate pad region (GP). In this case, the transparent conductive layer 502 may be formed of ITO (Indium Tin Oxide), IZO (Indium Zinc Oxide), AZO, or ZnO. And, the first metal layer 501 may be formed of copper (Cu), copper alloy (Cu Alloy), aluminum (Al), aluminum neodymium (AlNd), molybdenum (Mo), molybdenum alloy (Mo Alloy), chrome (Cr), chrome alloy (Cr Alloy), titanium alloy (Ti Alloy), argentum (Ag), or argentum alloy (Ag Alloy). Preferably, the first metal layer 501 is formed of a stacked layer of Mo/AlNd.

A wet etching process may be used to etch the first metal layer 501 and the transparent conductive layer 502 together. Then, the lower capacitor electrode 532 and the gate line 512 may be formed separately. However, as shown in FIG. 9A, portions of the gate line 512 may function as the lower capacitor electrode 532.

Figure 8B:
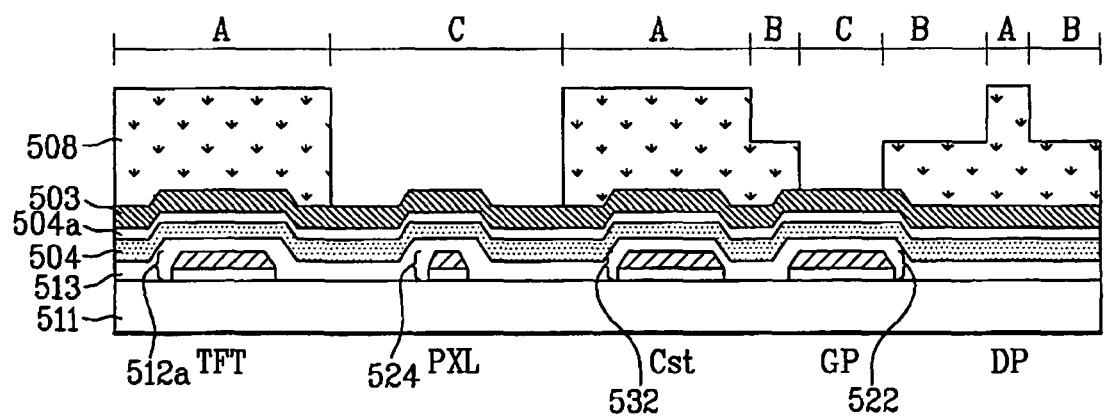
Figure 9A:
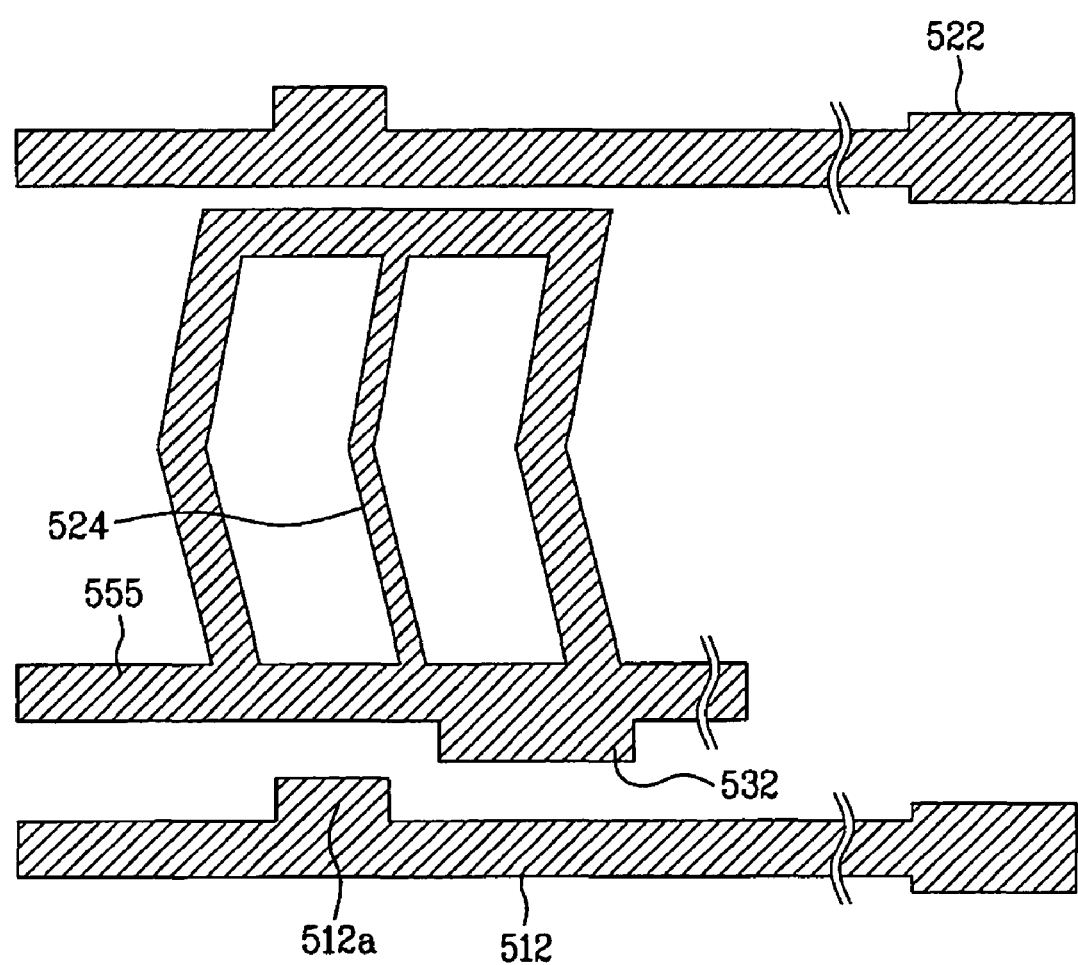
FIGS. 9A to 9D show plane views of the exemplary steps for fabricating the TFT array substrate corresponding to FIGS. 8A, 8E, 8F and 8G, respectively.

As shown in FIG. 8B, an inorganic material of silicon nitride (SiNx) or silicon oxide (SiOx) is deposited on the entire surface of the substrate 511 including the gate electrode 512a to form the gate insulation layer 513. Subsequently, amorphous silicon (a-Si) 504 and amorphous silicon doped with impurity ions (n+a-Si) 504a are sequentially formed on the gate insulation layer 513. Thereon, the second metal layer 503 is formed by sputtering. The second metal layer 503 may be formed of copper (Cu), copper alloy (Cu Alloy), aluminum (Al), aluminum neodymium (AlNd), molybdenum (Mo), molybdenum alloy (Mo Alloy), chrome (Cr), chrome alloy (Cr Alloy), titanium (Ti), titanium alloy (Ti Alloy), argentum (Ag), or argentum alloy (Ag Alloy). The second metal layer 503 may be formed of molybdenum (Mo). Then, the amorphous silicon (a-Si) 504 may be formed at a thickness of about 1700 Å, the amorphous silicon doped with impurity ions (n+a-Si) 504a may be formed at a thickness of about 300 Å, and the second metal layer 503 may be formed at a thickness of about 2000 Å.

Then, the stacked layer of the gate insulation layer 513, the amorphous silicon 504, the n+a-Si 504a, and the second metal layer 503 is selectively patterned by photolithography using a second exposure mask. For example, after coating a photoresist 508 of UV-curable resin by a spinning method or a roll-coating method on the second metal layer 503, the photoresist 508 is covered with a second exposure mask (not shown) having a desired pattern. Then, the photoresist 508 covered is exposed to UV-ray or X-ray through the second exposure mask, and the exposed photoresist is developed, thereby forming a photoresist pattern having the desired step coverage.

In this case, the second exposure mask may be formed of a diffraction exposure mask. To form the diffraction exposure mask, a light-shielding layer of a metal material and a semi-transparent layer are formed on a transparent substrate. Thus, the diffraction exposure mask includes three regions corresponding to a transparent region, a semi-transparent region, and a light-shielding region. The transparent region has the light transmittance of 100%, the light-shielding region has the light transmittance of 0%, and the semi-transparent region has the light transmittance between 0% and 100%. After applying the diffraction exposure to the photoresist, the photoresist 508 is divided into three regions: region C which is aligned with the transparent region of the diffraction exposure mask and is completely removed after the development process, region A which is aligned with the light-shielding region of the diffraction exposure mask and is not removed from the alignment process, and region B which is aligned with the semi-transparent region of the diffraction exposure mask and has a predetermined thickness.

After the diffraction exposure and development process, the photoresist 508 has the desired step coverage. The A region corresponds to portions for forming the data line, the source and drain electrodes, the upper capacitor electrode and the data pad. The C region corresponds to portions for forming the common electrode, the pixel electrode and the gate pad. The B regions corresponds to other portions.

Figure 8C:
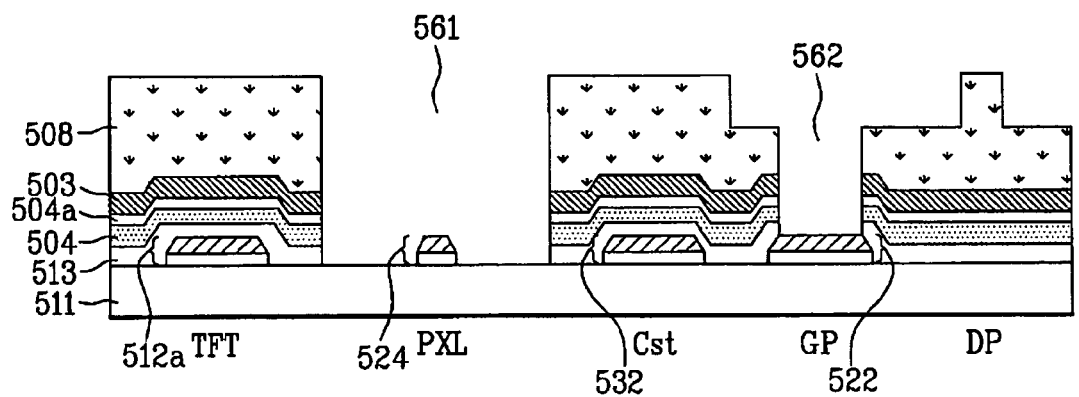

As shown in FIG. 8C, the gate insulation layer 513, the amorphous silicon 504, the n+a-Si 504a, and the second metal layer 503 are etched together using the photoresist 508 having the step coverage as a mask to form the first and second open areas 561 and 562 exposing the common electrode 524 and the gate pad 522. In this case, the first open area 561 is formed in the entire area of the sub-pixel region, so that the common electrode 524 is formed in the first open area 561 as well as the pixel electrode to be subsequently formed.

When etching the gate insulation layer 513, the amorphous silicon 504, the n+a-Si 504a, and the second metal layer 503, they may be etched together in one dry-etching chamber. In this case, different kinds of etching gases may be provided. For example, SF6, C12 or O2 may be used as the etching gas for etching the second metal layer (Mo). SF6, C12 or H2 may be used as the etching gas for etching the amorphous silicon material. SF6, O2 or may be used as the etching gas for etching the gate insulation layer.

Figure 8D:
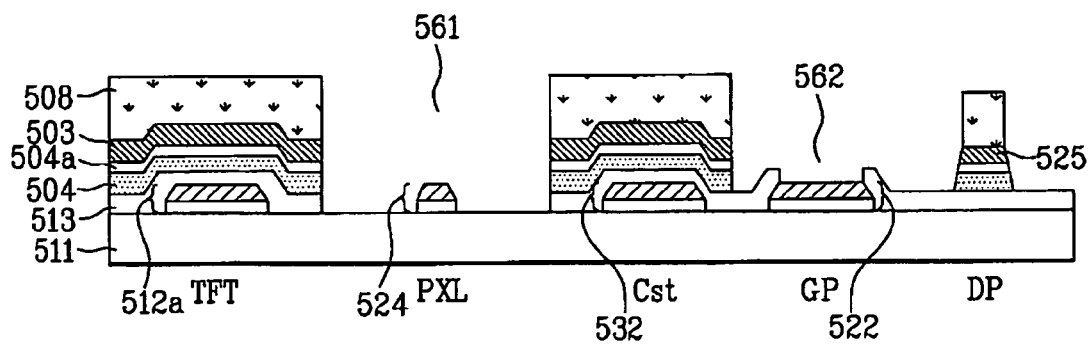

As shown in FIG. 8D, the photoresist 508 is ashed until a thinner portion of the photoresist 508 is completely removed. After ashing the photoresist 508, the exposed portions of the amorphous silicon 504, the n+a-Si 504a, and the second metal layer 503, are etched one at a time while preserving the gate insulation layer 513. The dry-etching process is performed such that the etching gas for the gate insulation layer 513 is different in etching-selection ratio from the etching gases for the other-material layers to leave the gate insulation layer 513. The gate insulation layer 513 is removed from the first and second open areas 561 and 562 leaving the other portions of the gate insulation layer 513 to protect the gate line 512.

Figure 8E:
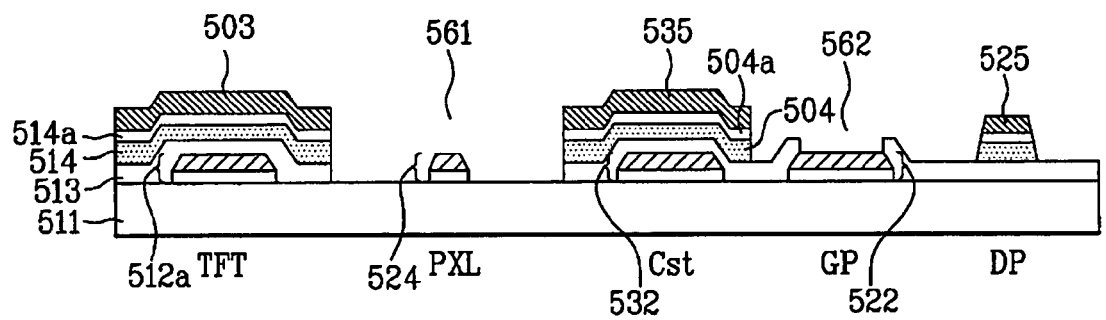
Figure 9B:
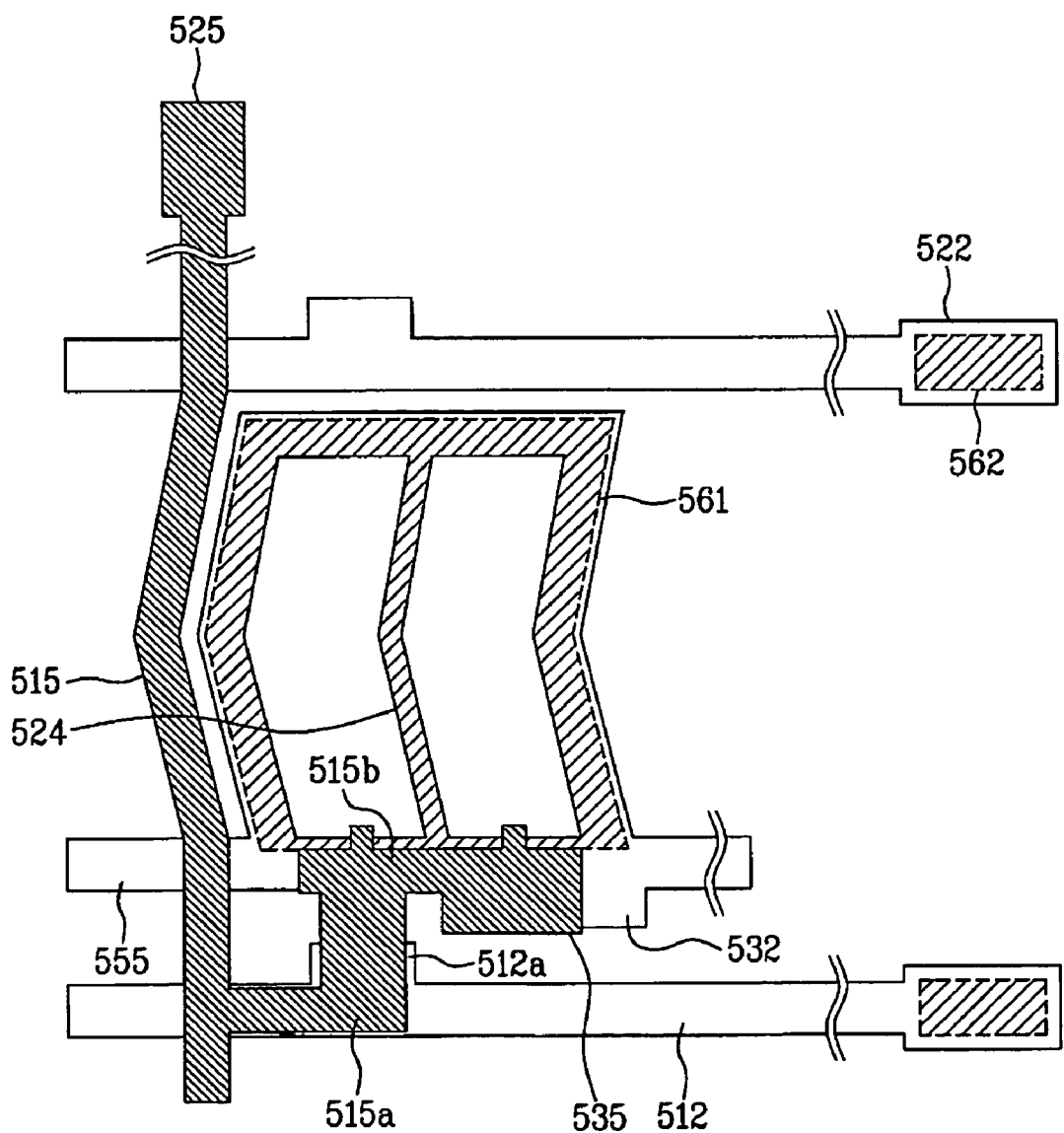

As shown in FIGS. 8E and 9B, the remaining portion of the photoresist 508 is completely removed to complete the data line 515, the stacked layer of the semiconductor layer 514, the ohmic contact layer 514a, and exposed portions of the second metal layer 503 covering the TFT region, the upper capacitor electrode 535 of the storage capacitor region (Cst), the data pad 525 of the data pad region (DP), the first open areas 561 exposing the pixel electrode 517, and the second open areas 562 exposing the gate pad 522.

Figure 8F:
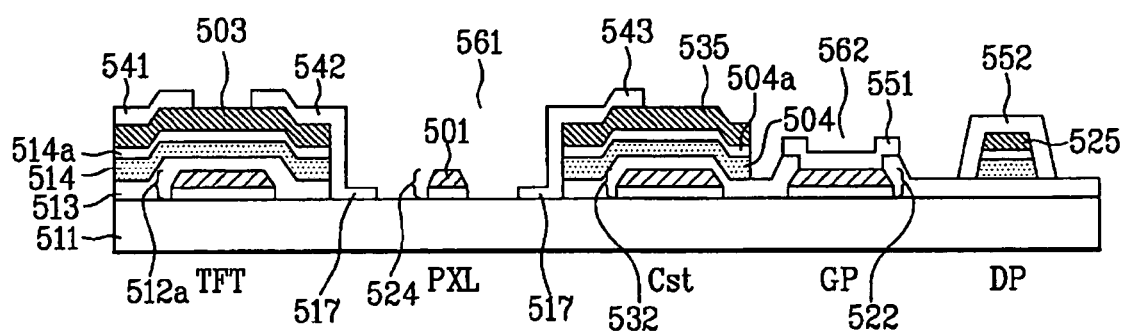
Figure 9C:
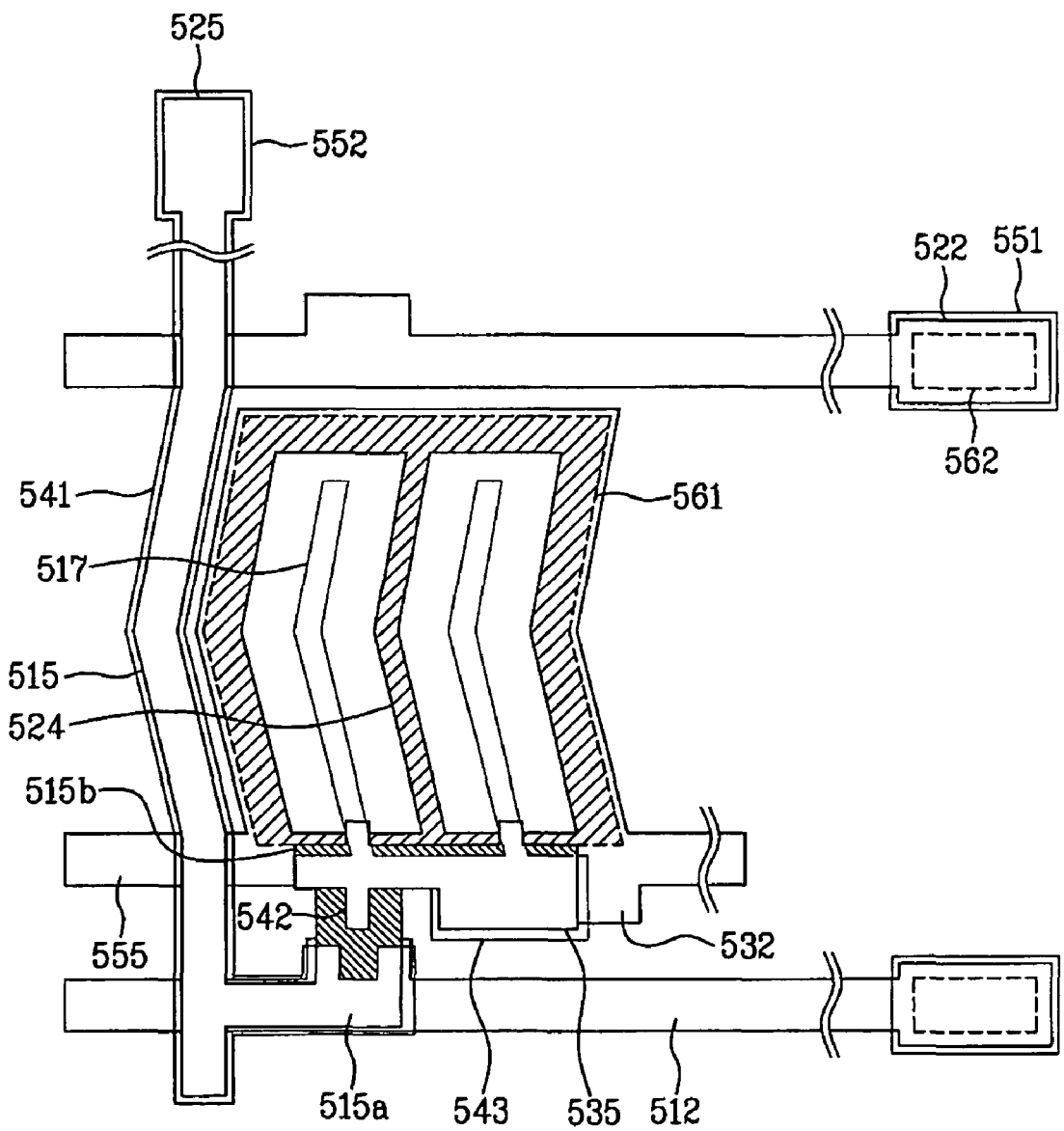

As shown in FIGS. 8F and 9C, a conductive material is deposited on the entire surface of the substrate 511, and is then patterned by photolithography using a third exposure mask to form first, second and third masking layers 541, 542 and 543, first and second oxidation-prevention layers 551 and 552, and the pixel electrode 517. Then, the conductive material may be formed of the transparent conductive material such as ITO (Indium Tin Oxide), IZO (Indium Zinc Oxide), AZO or ZnO, or may be formed of the metal layer of Ti or Ti alloy which is not easily oxidized or eroded. The pixel electrode 517 provided in the opening of the sub-pixel region is formed of the transparent conductive material. This is because that the transparent conductive material provides a good aperture ratio of device.

The first masking layer 541 covers the data line 515 and a first portion of the second metal layer 503 in the TFT region. The second masking layer 142 covers a second portion of the second metal layer 503 in the TFT region, an extended portion thereof integrally forming one of the pixel electrodes 517 on the transparent substrate 511. A third portion of the second metal layer 503 remains exposed between the first and second masking layers 541 and 542 in the TFT region.

The third masking layer 543 covers portions of the upper capacitor electrode 535, an extended portion thereof integrally forming another one of the pixel electrodes 517 on the transparent substrate 511. Thus, the second and third masking layers 542 and 543 are integrally formed as one body with the pixel electrode 517. The upper capacitor electrode 535 etched by the third masking layer 543 is prevented from being short-circuited with the pixel electrode 517 of the adjacent sub-pixel region, by covering a portion of the upper capacitor electrode 535 with the third masking layer 543.

The first and second oxidation-prevention layers 551 and 552 respectively cover the gate pad 522 and the data pad 525. The first and second oxidation-prevention layers prevent the gate pad 522 and the data pad 525 from being oxidized, and improve the contact property between the gate and data pads and the external driving circuit. Then, the second oxidation-prevention layer 552 is formed as one body with the first masking layer 541, to thereby prevent the data line 515 from being opened in the following process.

Figure 8G:
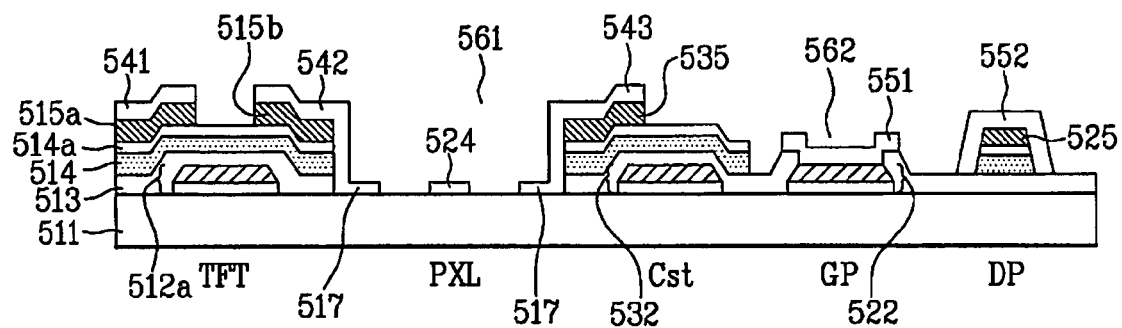
Figure 9D:
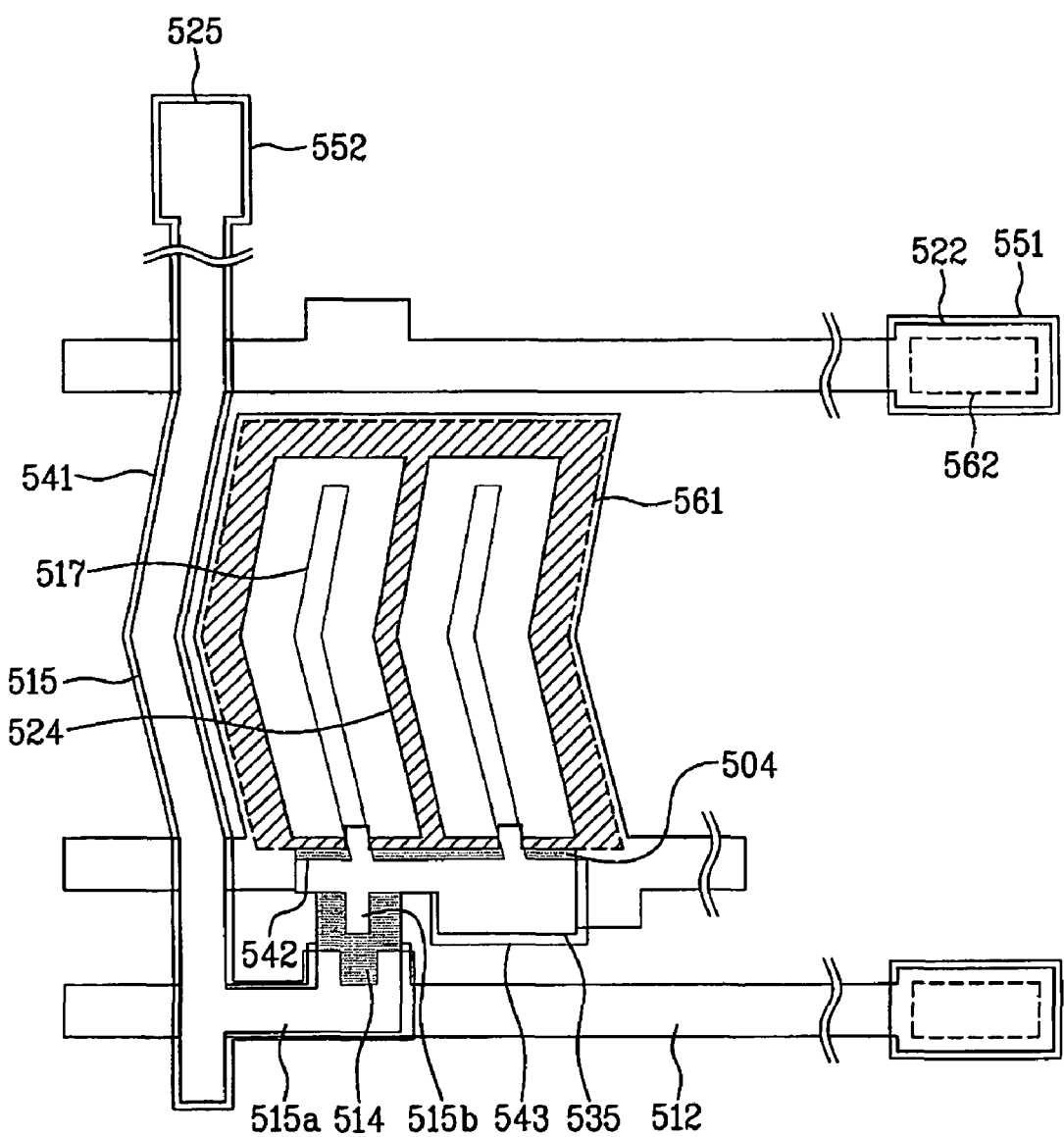

As shown in FIGS. 8G and 9D, the exposed portions of the first and second metal layers 501 and 503 are selectively wet-etched using the first, second and third masking layers 541, 542 and 543 as a mask. Then, the etchant may be used of phosphoric acid, acetic acid or nitric acid based material. If providing the dry-etching process, the second metal layer of Mo is etched, but the first metal layer of Mo/AlNd is not etched due to the AlNd material. In this respect, the wet-etching process is applied. When using the metal layer of copper, it is impossible to apply the dry-etching process since the copper material is not etched by the dry-etching process.

Accordingly, by etching the second metal layer 503 in the TFT region, a source electrode 515a and a drain electrode 515b are formed under the first and second masking layers 541 and 542 in the TFT region defining a channel region between the source and drain electrodes 115a and 115b. Similarly, portions of the upper capacitor electrode 535 are removed from the storage capacitor region, and the exposed portion of the first metal layer 501 on the common electrode 525 is also etched. Accordingly, the common electrode 524 includes only the first transparent conductive layer 502.

Figure 8H:
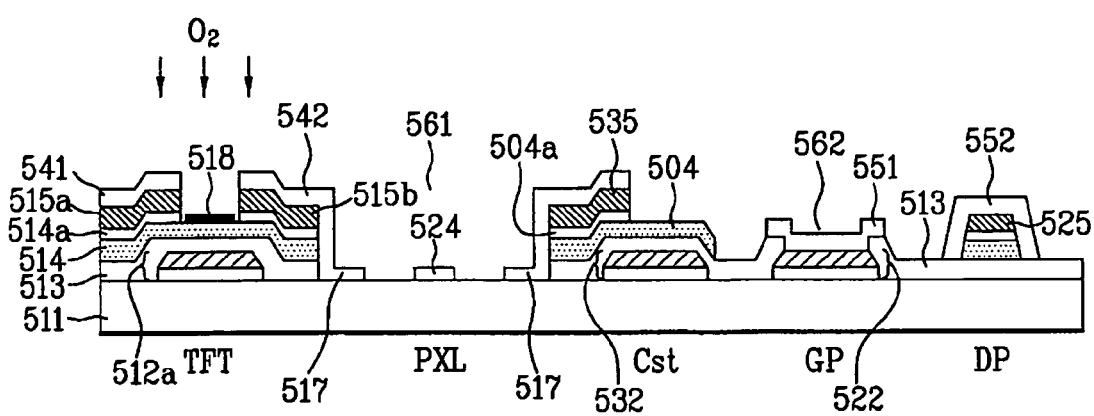

As shown in FIG. 8H, after dry-etching the ohmic contact layer (n+a-Si) positioned between the source and drain electrode 515a and 515b, the surface of the dry-etched ohmic contact layer is treated with O2 plasma, whereby the passivation layer 518 is formed on the channel region. By the surface treatment with O2 plasma, it is possible to prevent the undesired optical-current from generating in the channel region by protecting the channel region of the semiconductor layer, thereby preventing the TFT property from deteriorating. Then, the n+a-Si 104 of the storage capacitor region (Cst) is also etched during the process of etching the ohmic contact layer.

As a result, the method for fabricating the TFT array substrate according to the second embodiment of the present invention requires the three exposure masks, which is suitable for the technology of using the small number of masks.

In the method for fabricating the TFT array substrate according to the second embodiment of the present invention, the common electrode is formed on the same layer as the gate line layer, and the pixel electrode is formed on the same layer as the masking layer. However, it is possible that the common electrode and the pixel electrode are formed on the same layer as the gate line layer. To form the pixel electrode on the same layer as the gate line layer, the drain electrode is electrically connected with the pixel electrode through the use of the masking layer which covers the drain electrode because the drain electrode and the pixel electrode are formed on the different layers, in the same manner of the first embodiment of the present invention.

As mentioned above, the TFT array substrate and the method for fabricating the same according to the present invention have the following advantages.

First, each of the gate line layer and the pixel electrode is formed of the stacked layer of the metal layer and the transparent conductive layer. In the following process, the metal layer of the pixel electrode is removed, and the pixel electrode is electrically connected with the drain electrode. Thus, it is possible to complete the TFT array substrate of the TN mode LCD device with the three exposure masks.

Also, each of the gate line layer and the common electrode is formed of the stacked layer of the metal layer and the transparent conductive layer. In the following process, the metal layer of the common electrode is removed, and the pixel electrode is formed in parallel to the common electrode. Thus, it is possible to complete the TFT array substrate of the IPS mode LCD device with the three exposure masks. Accordingly, the fabrication time and the unit cost of production can be decreased.

Also, the passivation layer which insulates the data line layer from the pixel electrode is not required, thereby decreasing the manufacturing cost.

The gate insulation layer, the semiconductor layer, and the metal layer for the data line may be patterned together by the diffraction exposure.

As providing the masking layer, it is possible to etch the material of the lower layer without the exposure, to protect the pattern of the TFT array substrate from the external force, and to electrically connect the patterns provided on the different layers to each other.

Accordingly, it will be apparent to those skilled in the art that various modifications and variations can be made in embodiments of the present invention. Thus, it is intended that embodiments of the present invention cover the modifications and variations of the embodiments described herein provided they come within the scope of the appended claims and their equivalents.

What is claimed is:

1. A method for fabricating a TFT array substrate, comprising: sequentially depositing a first metal layer and a transparent conductive layer on a substrate; forming a gate line, a gate electrode, a gate pad and a pixel electrode by patterning the first metal layer and the transparent conductive layer using a first mask; depositing an insulation layer, an amorphous silicon layer and a second metal layer over the substrate; forming a semiconductor layer, a data line, a data pad, a first open area in a pixel region, and a second open area in the gate pad by patterning the amorphous silicon layer and the second metal layer using a second mask; depositing a conductive material over the substrate; forming first and second masking layers and first and second oxidation-prevention layers by patterning the conductive material using a third mask; forming source and drain electrodes by etching the second metal layer exposed between the first and second masking layers using the first and second masking layers as a mask to define a channel region; and exposing the transparent conductive layer of the pixel electrode by etching the first metal layer exposed through the first open area, and wherein the first and second open areas are formed by patterning the insulation layer, the amorphous silicon layer and the second metal layer using the second mask, wherein the first masking layer covers the data line and the source electrode, wherein the second masking layer covers the drain electrode and a portion of the first metal layer of the first open area, and connects the drain electrode to the pixel electrode, and wherein the first metal of the first open area contacts the insulation layer under the drain electrode, and wherein the first and second oxidation-prevention layers respectively cover the gate pad and the data pad.

2. The method of claim 1, further comprising treating a surface of the semiconductor layer in the channel region with $O_2$ plasma, after the step of forming source and drain electrodes.

3. The method of claim 1, wherein the etching of each of the first and second metal layers includes a wet-etching process.

4. The method of claim 3, wherein the first metal layer includes one of aluminum, aluminum neodymium and copper, and the second metal layer includes one of molybdenum and molybdenum alloy.

5. The method of claim 1, wherein the first and second masking layers and the first and second oxidation-prevention layers are formed of a metal layer,
wherein the metal layer is titanium or titanium alloy.

6. The method of claim 1, wherein the step of forming the gate line, the gate electrode, the gate pad and the pixel electrode further comprising: forming a lower capacitor electrode, and
wherein the step forming the semiconductor layer, the data line, the data pad, and the first and second open areas further comprising: forming an upper capacitor electrode overlapping the lower capacitor electrode.

7. The method of claim 6, wherein the insulation layer and the amorphous silicon layer are formed between the lower capacitor electrode and the upper capacitor electrode.

8. The method of claim 7, wherein the step of forming first and second masking layers and first and second oxidation-prevention layers further comprising: forming a third masking layer on the upper capacitor electrode to connect the upper capacitor electrode to the pixel electrode.

9. The method of claim 1, wherein the first masking layer formed on the data line is integrally formed with the second oxidation-prevention layer on the data pad as a single body.

10. The method of claim 1, wherein the second mask includes a diffraction exposure mask.

11. The method of claim 1, wherein the step of forming the semiconductor layer, the data line, the data pad, and the first and second open areas further comprising:
forming a photoresist layer having a step coverage on the second metal layer by using the second mask;
forming the first and second open areas by removing the staked layer of the insulation layer, the amorphous silicon layer and the second metal layer selectively in state of using the photoresist layer as a mask;
removing a thinner portion of the photoresist layer by an ashing process; and
forming the semiconductor layer, the data line, and the data pad by etching the amorphous silicon layer and the second metal layer using the ashed photoresist layer as a mask.

12. The method of claim 11, wherein the insulation layer, the amorphous silicon layer and the second metal layer are etched together in a dry-etching method.

13. The method of claim 1, wherein the pixel electrode is formed in the entire area of the sub-pixel region.

* * * * *